(12) United States Patent
Yantchev et al.

(10) Patent No.: US 12,549,151 B2
(45) Date of Patent: Feb. 10, 2026

(54) TRANSVERSELY-EXCITED FILM BULK ACOUSTIC RESONATOR WITH THICK DIELECTRIC LAYER FOR IMPROVED COUPLING

(71) Applicant: Murata Manufacturing Co., Ltd., Nagaokakyo (JP)

(72) Inventors: Ventsislav Yantchev, Sofia (BG); Sean McHugh, Santa Barbara, CA (US); Bryant Garcia, Mississauga (CA); Patrick Turner, Portola Valley, CA (US); John P. Koulakis, Los Angeles, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 327 days.

(21) Appl. No.: 18/194,256

(22) Filed: Mar. 31, 2023

(65) Prior Publication Data

US 2023/0327637 A1   Oct. 12, 2023

Related U.S. Application Data

(60) Provisional application No. 63/394,269, filed on Aug. 1, 2022, provisional application No. 63/331,163, filed
(Continued)

(51) Int. Cl.
*H03H 9/02* (2006.01)
*G01N 29/02* (2006.01)
(Continued)

(52) U.S. Cl.
CPC ....... *H03H 9/02228* (2013.01); *G01N 29/022* (2013.01); *G01N 29/036* (2013.01);
(Continued)

(58) Field of Classification Search
CPC .......... H03H 9/02228; H03H 9/02015; H03H 9/174; H03H 9/02062; H03H 9/02102;
(Continued)

(56) References Cited

U.S. PATENT DOCUMENTS

| 5,705,399 A | 1/1998 | Larue |
| 5,853,601 A | 12/1998 | Krishaswamy et al. |

(Continued)

FOREIGN PATENT DOCUMENTS

| CN | 1926763 A | 3/2007 |
| CN | 201893487 U | 7/2011 |

(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Jorge L Salazar, Jr.
(74) *Attorney, Agent, or Firm* — ArentFox Schiff LLP

(57) ABSTRACT

A bulk acoustic resonator that includes a substrate, a piezoelectric plate, and an interdigital transducer (IDT) formed on the front surface of the piezoelectric plate. The IDT is configured to excite a primary shear acoustic mode within the piezoelectric plate. Also included is a half-lambda dielectric layer on at least one of the front surface or the back surface of the piezoelectric plate, where a thickness of the half-lambda dielectric layer is related to a wavelength of a fundamental shear bulk acoustic wave resonance in the half-lambda dielectric layer. The device further includes an acoustic Bragg reflector sandwiched between the surface of the substrate and the back surface of the piezoelectric plate, the acoustic Bragg reflector configured to reflect the primary acoustic mode. A top layer of the alternating layers of the
(Continued)

acoustic Bragg reflector contacts the piezoelectric plate or the half-lambda dielectric layer.

19 Claims, 21 Drawing Sheets

Related U.S. Application Data on Apr. 14, 2022, provisional application No. 63/330,284, filed on Apr. 12, 2022.

(51) Int. Cl.
  *G01N 29/036* (2006.01)
  *H03H 9/17* (2006.01)

(52) U.S. Cl.
  CPC ........ *H03H 9/02015* (2013.01); *H03H 9/174* (2013.01); *G01N 2291/0256* (2013.01); *G01N 2291/0426* (2013.01)

(58) Field of Classification Search
  CPC .............. H03H 9/02157; H03H 9/175; H03H 9/02047; G01N 29/022; G01N 29/036; G01N 2291/0256; G01N 2291/0426; G01N 2291/022; G01N 2291/0423; G01N 29/2437; G01N 5/00; G01G 9/00
  USPC .................................................. 333/186–188
  See application file for complete search history.

(56) References Cited

U.S. PATENT DOCUMENTS

| | | |
|---|---|---|
| 6,540,827 B1 | 4/2003 | Levy et al. |
| 6,707,229 B1 | 3/2004 | Martin |
| 7,135,940 B2 | 11/2006 | Kawakubo et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,802,466 B2 | 9/2010 | Whalen et al. |
| 7,868,519 B2 | 1/2011 | Umeda |
| 8,278,802 B1 | 10/2012 | Lee et al. |
| 8,344,815 B2 | 1/2013 | Yamanaka |
| 8,829,766 B2 | 9/2014 | Milyutin et al. |
| 8,932,686 B2 | 1/2015 | Hayakawa et al. |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,748,923 B2 | 8/2017 | Kando et al. |
| 9,780,759 B2 | 10/2017 | Kimura et al. |
| 10,200,013 B2 | 2/2019 | Bower et al. |
| 10,305,447 B2 | 5/2019 | Raihn et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,756,697 B2 | 8/2020 | Plesski et al. |
| 10,790,802 B2 | 9/2020 | Yantchev et al. |
| 10,797,675 B2 | 10/2020 | Plesski |
| 10,826,462 B2 | 11/2020 | Plesski et al. |
| 10,868,513 B2 | 12/2020 | Yantchev |
| 2002/0079986 A1 | 6/2002 | Ruby et al. |
| 2002/0158714 A1 | 10/2002 | Kaitila et al. |
| 2003/0199105 A1 | 10/2003 | Kub et al. |
| 2004/0041496 A1 | 3/2004 | Imai et al. |
| 2004/0090145 A1 | 5/2004 | Bauer et al. |
| 2004/0207033 A1 | 10/2004 | Koshido |
| 2004/0207485 A1 | 10/2004 | Kawachi et al. |
| 2004/0261250 A1 | 12/2004 | Kadota et al. |
| 2005/0280476 A1 | 12/2005 | Abe et al. |
| 2006/0072875 A1 | 4/2006 | Bhagavatula et al. |
| 2006/0125489 A1 | 6/2006 | Feucht et al. |
| 2006/0131731 A1 | 6/2006 | Sato |
| 2006/0152107 A1 | 7/2006 | Tanaka |
| 2006/0222568 A1 | 10/2006 | Wang et al. |
| 2007/0001549 A1 | 1/2007 | Kando et al. |
| 2007/0090898 A1 | 4/2007 | Kando |
| 2007/0170565 A1 | 7/2007 | Hong et al. |
| 2007/0188047 A1 | 8/2007 | Tanaka |
| 2007/0194863 A1 | 8/2007 | Shibata et al. |
| 2010/0064492 A1 | 3/2010 | Tanaka |
| 2010/0102669 A1 | 4/2010 | Yamanaka |
| 2010/0107388 A1 | 5/2010 | Iwamoto |
| 2010/0123367 A1 | 5/2010 | Tai et al. |
| 2010/0212127 A1 | 8/2010 | Heinze et al. |
| 2010/0223999 A1 | 9/2010 | Onoe |
| 2010/0301703 A1 | 12/2010 | Chen et al. |
| 2011/0109196 A1 | 5/2011 | Goto |
| 2011/0199163 A1 | 8/2011 | Yamanaka |
| 2011/0278993 A1 | 11/2011 | Iwamoto |
| 2013/0015353 A1 | 1/2013 | Tai et al. |
| 2013/0021116 A1 | 1/2013 | Sogoya et al. |
| 2013/0057360 A1 | 3/2013 | Meltaus et al. |
| 2013/0321100 A1 | 12/2013 | Wang |
| 2014/0001919 A1 | 1/2014 | Komatsu |
| 2014/0009032 A1 | 1/2014 | Takahashi et al. |
| 2014/0113571 A1 | 4/2014 | Fujiwara |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0218129 A1 | 8/2014 | Fujiwara |
| 2014/0225684 A1 | 8/2014 | Kando et al. |
| 2014/0312994 A1 | 10/2014 | Meltaus et al. |
| 2015/0070227 A1 | 3/2015 | Kishino et al. |
| 2015/0319537 A1 | 11/2015 | Perois et al. |
| 2015/0333730 A1 | 11/2015 | Meltaus |
| 2016/0028367 A1 | 1/2016 | Shealy |
| 2016/0049920 A1 | 2/2016 | Kishino |
| 2016/0182009 A1 | 6/2016 | Bhattacharjee |
| 2016/0285430 A1 | 9/2016 | Kikuchi et al. |
| 2017/0005638 A1 | 1/2017 | Otagawa et al. |
| 2017/0063332 A1 | 3/2017 | Gilbert et al. |
| 2017/0077902 A1 | 3/2017 | Daimon |
| 2017/0104470 A1 | 4/2017 | Koelle et al. |
| 2017/0170808 A1 | 6/2017 | Iwaki et al. |
| 2017/0179928 A1 | 6/2017 | Raihn et al. |
| 2017/0187352 A1 | 6/2017 | Omura |
| 2017/0214387 A1 | 7/2017 | Burak et al. |
| 2017/0222618 A1 | 8/2017 | Inoue et al. |
| 2017/0222622 A1 | 8/2017 | Solal et al. |
| 2017/0264263 A1 | 9/2017 | Huang et al. |
| 2017/0324394 A1 | 11/2017 | Ebner et al. |
| 2017/0359050 A1 | 12/2017 | Irieda et al. |
| 2017/0370791 A1 | 12/2017 | Nakamura et al. |
| 2018/0062604 A1 | 3/2018 | Koskela et al. |
| 2018/0123016 A1 | 5/2018 | Gong et al. |
| 2018/0152169 A1 | 5/2018 | Goto et al. |
| 2018/0191322 A1 | 7/2018 | Chang et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0148621 A1 | 5/2019 | Feldman et al. |
| 2019/0181833 A1 | 6/2019 | Nosaka |
| 2019/0204205 A1* | 7/2019 | Hentz .................... G01H 13/00 |
| 2019/0245518 A1 | 8/2019 | Ito |
| 2019/0273480 A1 | 9/2019 | Lin |
| 2019/0273481 A1 | 9/2019 | Michigami |
| 2019/0386635 A1 | 12/2019 | Plesski et al. |
| 2019/0386637 A1 | 12/2019 | Plesski et al. |
| 2019/0386638 A1 | 12/2019 | Kimura et al. |
| 2020/0007110 A1 | 1/2020 | Konaka et al. |
| 2020/0021271 A1 | 1/2020 | Plesski et al. |
| 2020/0091893 A1 | 3/2020 | Plesski et al. |
| 2020/0162052 A1 | 5/2020 | Matsuoka et al. |
| 2020/0220522 A1 | 7/2020 | Nosaka |
| 2020/0228087 A1 | 7/2020 | Michigami et al. |
| 2020/0304091 A1 | 9/2020 | Yantchev |
| 2020/0328728 A1 | 10/2020 | Nakagawa et al. |
| 2020/0336130 A1 | 10/2020 | Turner |
| 2020/0373907 A1 | 11/2020 | Garcia |
| 2021/0006228 A1 | 1/2021 | Garcia |

(56) References Cited

U.S. PATENT DOCUMENTS

| | | |
|---|---|---|
| 2021/0013859 A1 | 1/2021 | Turner et al. |
| 2021/0013868 A1 | 1/2021 | Plesski |
| 2021/0126619 A1 | 4/2021 | Wang et al. |
| 2021/0273631 A1 | 9/2021 | Jachowski et al. |
| 2021/0384885 A1 | 12/2021 | Daimon et al. |
| 2022/0103160 A1 | 3/2022 | Jachowski |
| 2022/0216842 A1 | 7/2022 | Nagatomo et al. |
| 2022/0231661 A1 | 7/2022 | McHugh |

FOREIGN PATENT DOCUMENTS

| | | |
|---|---|---|
| CN | 112352382 A | 2/2021 |
| DE | 112011100580 T5 | 1/2013 |
| JP | H0522074 A | 1/1993 |
| JP | H10209804 A | 8/1998 |
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2010103803 A | 5/2010 |
| JP | 2010109949 A | 5/2010 |
| JP | 2010233210 A | 10/2010 |
| JP | 2013528996 A | 7/2013 |
| JP | 2015054986 A | 3/2015 |
| JP | 2016001923 A | 1/2016 |
| JP | 2017220910 A | 12/2017 |
| JP | 2018166259 A | 10/2018 |
| JP | 2018207144 A | 12/2018 |
| JP | 2019186655 A | 10/2019 |
| JP | 2020088459 A | 6/2020 |
| JP | 2020113939 A | 7/2020 |
| WO | 2010047114 A1 | 4/2010 |
| WO | 2013021948 A1 | 2/2013 |
| WO | 2015098694 A1 | 7/2015 |
| WO | 2015156232 A1 | 10/2015 |
| WO | 2015182521 A1 | 12/2015 |
| WO | 2016017104 A1 | 2/2016 |
| WO | 2016052129 A1 | 4/2016 |
| WO | 2016147687 A1 | 9/2016 |
| WO | 2018003273 A1 | 1/2018 |
| WO | 2018079522 A1 | 5/2018 |
| WO | 2018163860 A1 | 9/2018 |
| WO | 2019138810 A1 | 7/2019 |
| WO | 2019241174 A1 | 12/2019 |
| WO | 2020092414 A2 | 5/2020 |
| WO | 2020175234 A1 | 9/2020 |
| WO | 2021060523 A1 | 4/2021 |
| WO | 2023002858 A1 | 1/2023 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate Mems Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi: 10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary "Meaning of diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, © 2018 TIBTECH Innovations (Year 2018).

Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.

Wei Pang et al. "Analytical and experimental study on the second harmonic mode response of a bulk acoustic wave resonator" 2010 J. Micromech. Microeng. 20 115015; doi: 10.1088/0960-1317/20/11/115015.

Durmus et al. "Acoustic-Based Biosensors" Encyclopedia of Microfluidics and Nanofluidics. DOI 10.1007/978-3-642-27758-0_10-2 Springer Science+Business Media New York 2014.

USPTO/ISA, International Search Report and Written Opinion for PCT Application No. PCT/US2023/017732 dated Jul. 27, 2023.

USPTO/ISA, International Search Report and Written Opinion for PCT Application No. PCT/US2022/082421 dated May 3, 2023.

USPTO/ISA, International Search Report and Written Opinion for PCT Application No. PCT/US2022/081095 dated May 30, 2023.

USPTO/ISA, International Search Report and Written Opinion for PCT Application No. PCT/US2022/079236 dated Mar. 10, 2023.

USPTO/ISA, International Search Report and Written Opinion for PCT Application No. PCT/US2022/081068 dated Apr. 18, 2023.

USPTO/ISA, International Search Report and Written Opinion for PCT Application No. PCT/US2022/080246 dated Mar. 30, 2023.

Gong et al., "Design and Analysis of Lithium-Niobate-Based High Electromechanical Coupling RF-MEMS Resonators for Wideband Filtering", IEEE Transactions on Microwave Theory and Techniques, vol. 61, No. 1, Jan. 2013, pp. 403-413.

* cited by examiner

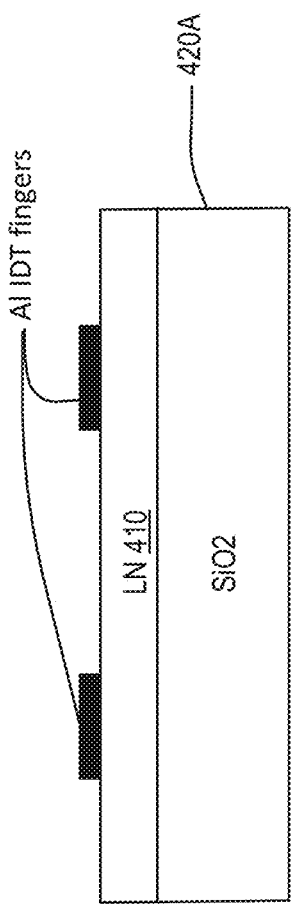
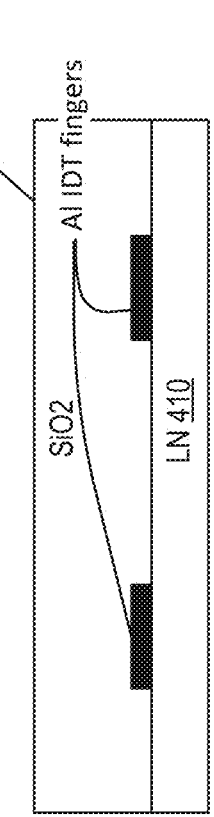
FIG. 4A
FIG. 4B

TRANSVERSELY-EXCITED FILM BULK ACOUSTIC RESONATOR WITH THICK DIELECTRIC LAYER FOR IMPROVED COUPLING

CROSS REFERENCE TO RELATED APPLICATIONS

The current application claims priority to each of U.S. Patent Provisional Application No. 63/330,284, filed on Apr. 12, 2022, U.S. Patent Provisional Application No. 63/331,163, filed on Apr. 14, 2022, and U.S. Patent Provisional Application No. 63/394,269, filed on Aug. 1, 2022, the entire contents of which is hereby incorporated by reference.

TECHNICAL FIELD

This disclosure relates to transversely-excited film bulk acoustic resonators (XBARs), including XBARs suitable for gravimetric mass sensing, biosensing, and/or biochemical sensing applications.

BACKGROUND

Piezoelectric devices such as resonators have been employed as mass detectors in the related art. For example, piezoelectric resonators are used in related art applications for detecting very small quantities of materials. In such applications, the resonator is exposed to the material being detected to allow the material to bind on a surface of the resonator.

The material to be detected is often an analyte. A binding partner that binds the analyte may be coated onto a surface of the resonator. When the analyte contacts the surface of the resonator, the analyte binds to the binding partner on the surface, and the mass on the surface increases according to the mass of the bound (i.e., detected) analyte.

The changed mass of the resonator results in changes to the resonance frequency of the resonator. Accordingly, measurement of the change in resonance frequency of the resonator may be used to determine the changed mass of the resonator and, consequently, the mass of the detected analyte. This general structure is used in gravimetric sensors to produce a signal based on a change in mass.

Design and performance of acoustic wave mass sensors is based on the sensing environment, the frequency of the sensor application, as well as size and integration requirements. For example, acoustic wave mass sensors could be integrated in microfluidic systems or designed for operation in gas environments. Additionally, certain sensor applications may operate at high frequencies (e.g., above 5 GHz) and may require compact and/or arrayed design.

Mass sensors are widely applicable to detection of a variety of substances, such as, for example, chemical compounds, molecules, bacteria, etc. Accordingly, such devices find application in various fields, including in Internet of Things (IoT) systems, medical diagnostics, commercial chemical sensors, food and product quality control, and national security, among others. Accordingly, improvements in mass sensitivity of acoustic wave mass sensors, especially compact size sensors operating at high frequencies, may bring wide-ranging effects across various applications and industries.

SUMMARY

Thus, according to a described aspect, a bulk acoustic resonator is disclosed that includes a substrate having a surface; a piezoelectric plate having front and back surfaces; an interdigital transducer (IDT) at the front surface of the piezoelectric plate, wherein the IDT is configured to excite a primary shear acoustic mode within the piezoelectric plate; a half-lambda dielectric layer on at least one of the front surface or the back surface of the piezoelectric plate, wherein a thickness td of the half-lambda dielectric layer is defined as $0.85\lambda_{0,d} \leq 2td \leq 1.15\lambda_{0,d}$, where $\lambda_{0,d}$ is a wavelength of a fundamental shear bulk acoustic wave resonance in the half-lambda dielectric layer, wherein the thickness td of the half-lambda dielectric layer is in a direction normal to the surface of the substrate; and an acoustic Bragg reflector sandwiched between the substrate and at least one of the half-lambda dielectric layer and the back surface of the piezoelectric plate, the acoustic Bragg reflector configured to reflect the primary acoustic mode. Moreover, in this aspect, the acoustic Bragg reflector comprises alternating layers of a first material and a second material having a higher acoustic impedance than the first material, and a top layer of the alternating layers of the acoustic Bragg reflector contacts at least one of the half-lambda dielectric layer and the back surface of the piezoelectric plate or contacts the half-lambda dielectric layer.

In another exemplary aspect, a mass sensor device is provided that includes a substrate having a surface; a piezoelectric plate having front and back surfaces; an interdigital transducer (IDT) at the front surface of the piezoelectric plate; a first half-lambda dielectric layer at the front surface of the piezoelectric plate, such that the first half-lambda dielectric layer at least partially covers the IDT at the front surface of the piezoelectric plate; a second half-lambda dielectric layer at the back surface of the piezoelectric plate; and an acoustic Bragg reflector sandwiched between the surface of the substrate and the back surface of the piezoelectric plate, the acoustic Bragg reflector configured to reflect a primary acoustic mode. In this aspect, a thickness td of each of the first and second half-lambda dielectric layers is defined as $0.85\lambda_{0,d} \leq 2td \leq 1.15\lambda_{0,d}$, where $\lambda_{0,d}$ is a wavelength of a fundamental shear bulk acoustic wave resonance in the respective first and second half-lambda dielectric layers, wherein the thickness td of the first and second half-lambda dielectric layers is in a direction normal to the surface of the substrate, wherein the acoustic Bragg reflector comprises alternating layers of a first material and a second material having a higher acoustic impedance than the first material, and wherein a top layer of the second material of the alternating layers of the acoustic Bragg reflector contacts the second half-lambda dielectric layer.

The above simplified summary of example aspects serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows.

BRIEF DESCRIPTION OF THE DRAWINGS

The accompanying drawings, which are incorporated into and form a part of this specification, illustrate one or more example aspects of the present disclosure and, together with the detailed description, serve to explain their principles and implementations.

FIG. 4A is an schematic cross-sectional view of an SM XBAR in a first aspect.

FIG. 4B is an schematic cross-sectional view of an SM XBAR in a refinement of the first aspect.

FIG. 4I is a chart of the admittance of the SM XBAR in the first exemplary aspects.

Throughout this description, elements appearing in figures are assigned three-digit or four-digit reference designators, where the two least significant digits are specific to the element and the one or two most significant digits correspond to the figure number. An element that is not described in conjunction with a figure may be presumed to have the same characteristics and function as a previously described element having the same element-specific digits.

DETAILED DESCRIPTION

Figure 1:
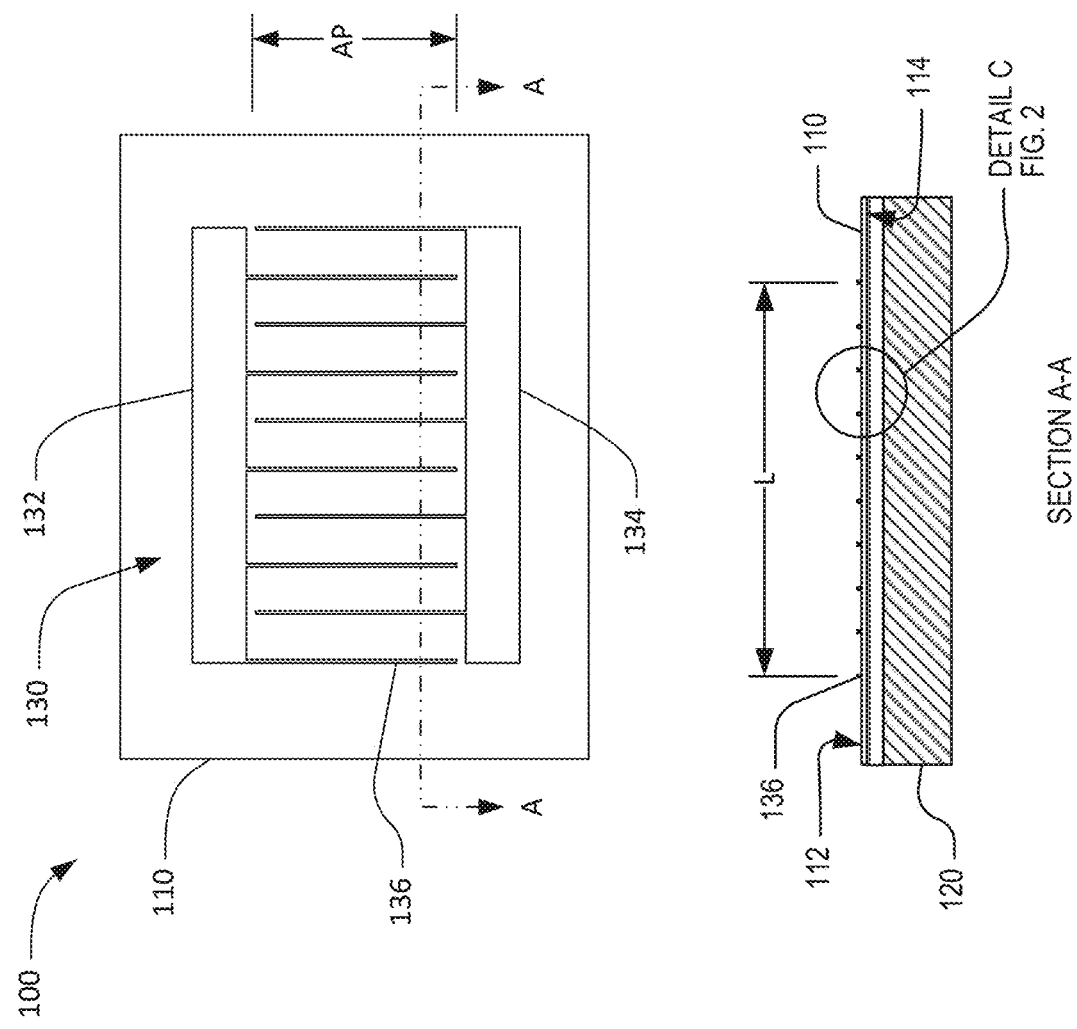
FIG. 1 includes a schematic plan view and a schematic cross-sectional view of a solidly-mounted transversely-excited film bulk acoustic resonator (SM XBAR).

FIG. 1 shows a simplified schematic top view and an orthogonal cross-sectional view of a solidly-mounted transversely-excited film bulk acoustic resonator (SM XBAR) 100. SM XBAR resonators such as the resonator 100 may be used in gravimetric mass sensor devices that produce a signal based on a change in mass. SM XBARs are particularly suited for use in high-frequency sensor applications operating at frequencies above 3 GHz.

The SM XBAR 100 is made up of a thin film conductor pattern formed on a front surface 112 of a piezoelectric plate 110 having parallel front and back surfaces 112, 114, respectively, which may also be referred to as top and bottom surfaces or first and second surfaces. The piezoelectric plate may be a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. SM XBARs may be fabricated on piezoelectric plates with various crystallographic orientations. In some cases, SM XBAR may refer to a transversely-excited film bulk acoustic resonator (XBAR) having a Bragg reflector, discussed in more detail below, rather than a cavity.

The back surface 114 of the piezoelectric plate 110 is mechanically supported by a substrate 120. The substrate 120 may be, for example, silicon, sapphire, quartz, or another suitable material. As will be described subsequently, the piezoelectric plate 110 may be attached to the substrate 120 via a plurality of intermediate material layers.

The conductor pattern of the SM XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT. Each finger of the first and second pluralities of fingers may be parallel to the X axis of the piezoelectric plate 110.

The first and second busbars 132, 134 serve as the terminals of the SM XBAR 100. A radio frequency or microwave signal applied between the two busbars 132, 134 of the IDT 130 excites an acoustic wave within the piezoelectric plate 110. As will be discussed in further detail, the excited acoustic wave is a bulk shear wave that propagates in the direction normal to the surface of the piezoelectric plate 110, which is also normal, or transverse, to the direction of the electric field created by the IDT fingers. Thus, the SM XBAR is considered a transversely-excited film bulk wave resonator.

For ease of presentation in FIG. 1, the geometric pitch and width of the IDT fingers are greatly exaggerated with respect to the length (dimension L) and aperture (dimension AP) of the SM XBAR. A typical SM XBAR has more than ten parallel fingers in the IDT. Some SM XBARs may have hundreds, possibly thousands, of parallel fingers in the IDT. Similarly, the thickness of the fingers in the cross-sectional views is greatly exaggerated.

Figure 2:
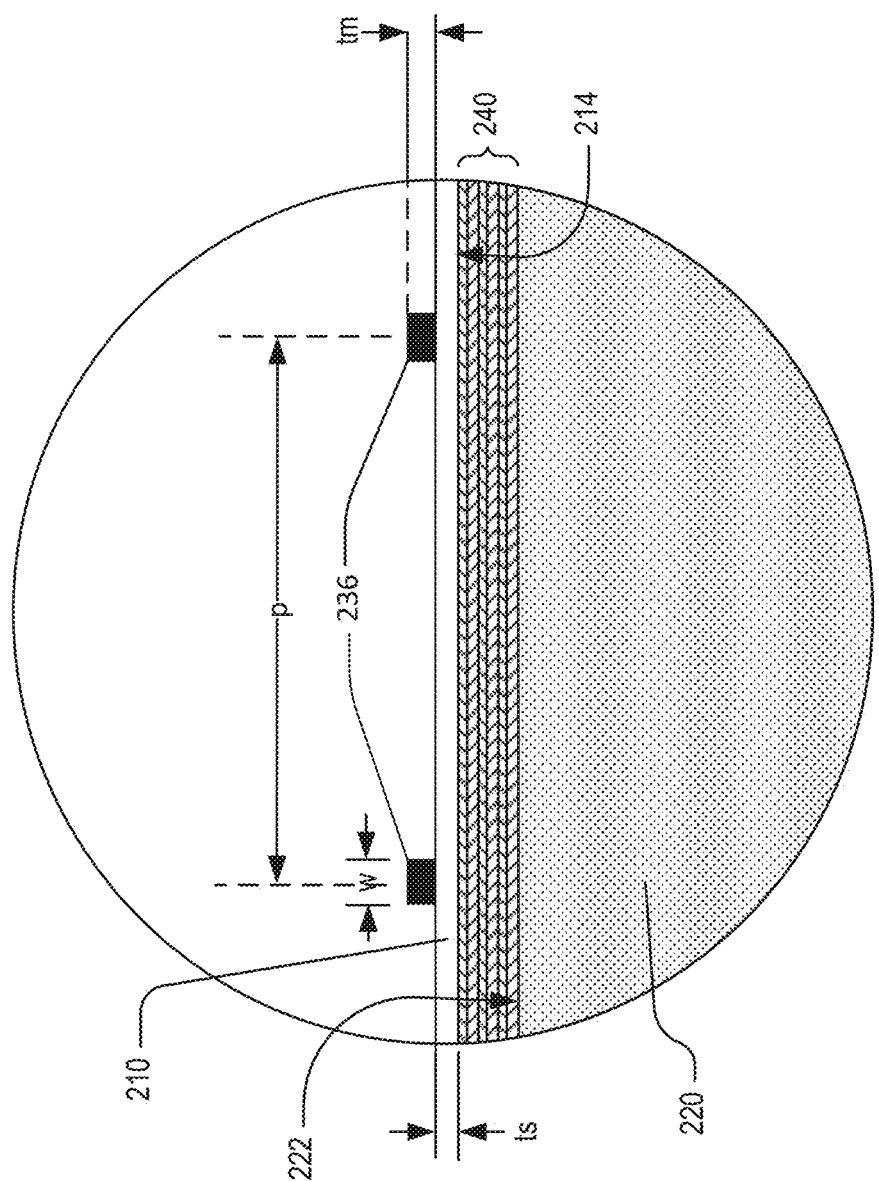
FIG. 2 is an expanded schematic cross-sectional view of a portion of the SM XBAR of FIG. 1.

FIG. 2 shows a detailed schematic cross-sectional view of the SM XBAR 100. The piezoelectric plate 210 may be a single-crystal layer of piezoelectrical material having a thickness ts, which may be, for example, 100 nm to 1500 nm. Generally, the term "thickness" used herein refers to a dimension measured in a direction normal to the surface of a substrate. The piezoelectric plate 210 can correspond to piezoelectric plate 110 as described above with respect to FIG. 1.

The IDT fingers 236 may be aluminum or a substantially aluminum alloy, copper or a substantially copper alloy, beryllium, gold, or another conductive material. Thin (relative to the total thickness of the conductive material) layers of other metals, such as chromium or titanium, may be formed under and/or over the fingers to improve adhesion between the fingers and the piezoelectric plate 210 and/or to passivate or encapsulate the fingers. The busbars (132, 134 in FIG. 1) of the IDT may be made of the same or different materials as the fingers in various exemplary aspects.

Dimension p is the center-to-center spacing or "pitch" of the IDT fingers, which may be referred to as the pitch of the IDT and/or the pitch of the SM XBAR. Dimension w is the width or "mark" of the IDT fingers. The IDT of an SM XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width w is about one-fourth of the acoustic wavelength at resonance). In an SM XBAR, the pitch p of the IDT is typically 2 to 20 times the width w of the fingers. In addition, the pitch p of the IDT is typically 2 to 20 times the thickness ts of the piezoelectric plate 210. The width of the IDT fingers in an SM XBAR is not constrained to one-fourth of the acoustic wavelength at resonance. For example, the width of SM XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

An acoustic Bragg reflector 240 is sandwiched between a surface 222 of the substrate 220 and the back surface 214 of the piezoelectric plate 210. The term "sandwiched" means the acoustic Bragg reflector 240 is disposed between and may be physically connected to the surface 222 of the substrate 220 and the back surface 214 of the piezoelectric plate 210. In some circumstances, layers of additional materials may be disposed between the acoustic Bragg reflector 240 and the surface 222 of the substrate 220 and/or between the Bragg reflector 240 and the back surface 214 of the piezoelectric plate 210. Such additional material layers may be present, for example, to facilitate bonding the piezoelectric plate 210, the acoustic Bragg reflector 240, and the substrate 220.

The acoustic Bragg reflector 240 includes multiple layers that alternate between materials having high acoustic impedance and materials having low acoustic impedance. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. Each of the layers has a thickness equal to, or about, one-fourth (~25%) of the acoustic wavelength at or near a resonance frequency of the SM XBAR 100. Thus, in an exemplary aspect, each of the alternating layers of the Bragg reflector can have thickness in a range of 75% to 125% of an acoustic wavelength corresponding to a resonance frequency of the bulk acoustic resonator. It is noted that the thickness of the alternating layers of the Bragg reflector is measured in the direction normal to the surface of the substrate.

In general, materials having comparatively low acoustic impedance include silicon dioxide, silicon oxycarbide, aluminum, and certain plastics such as cross-linked polyphenylene polymers. Materials having comparatively high acoustic impedance include silicon nitride, aluminum nitride, silicon carbide, and metals such as molybdenum, tungsten, gold, and platinum. All of the high acoustic impedance layers of the acoustic Bragg reflector 240 are not necessarily the same material, and all of the low acoustic impedance layers are not necessarily the same material. In the example of FIG. 2, the acoustic Bragg reflector 240 has a total of six layers. However, an acoustic Bragg reflector may have more than, or less than, six layers. Moreover, in an exemplary aspect, a top layer (i.e., a layer facing the piezoelectric plate) of the Bragg reflector can be in direct contact with the piezoelectric plate (e.g., piezoelectric plate 210) and specifically a back surface or back-side surface of the piezoelectric plate according to certain configurations described below. In other exemplary aspect, the top layer of the Bragg reflector can be in direct contact with the half lambda (i.e., a ≥λ/2 thick layer) dielectric layer according to the different configurations described below. In one aspect, the top layer of the Bragg reflector may be "high" acoustic impedance layer as described above.

Figure 3:
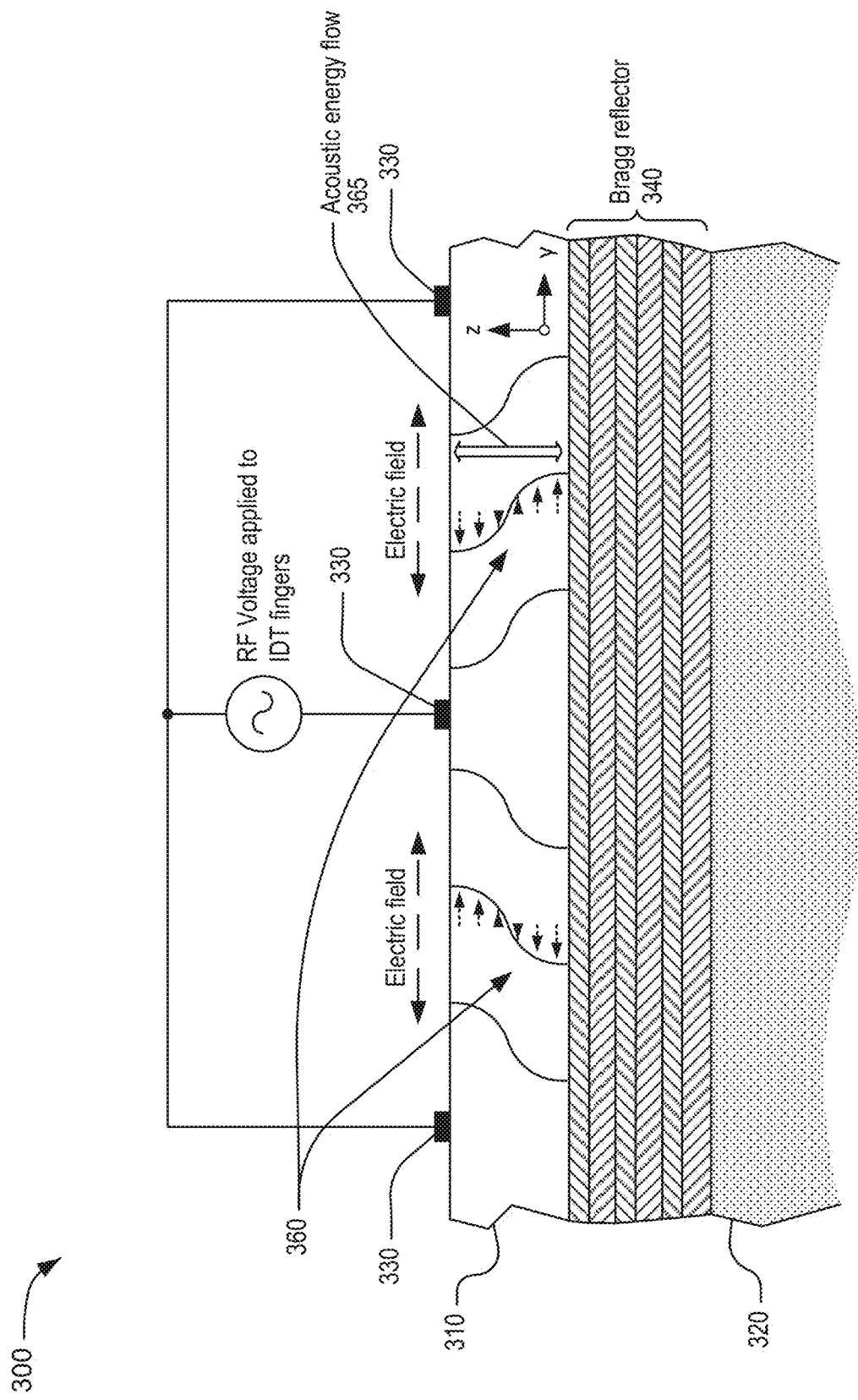
FIG. 3 is a graphic illustrating a shear primary acoustic mode in an SM XBAR.

FIG. 3 is a graphical illustration of the primary acoustic mode in a SM XBAR 300. FIG. 3 shows a small portion of the SM XBAR 300 including a piezoelectric plate 310 and three interleaved IDT fingers 330. The piezoelectric plate 310 may be single-crystal lithium niobate cut such that the z-axis is normal to the surfaces of the plate. The IDT fingers may be oriented parallel to the x-axis of the plate such that the y-axis is normal to the fingers. The piezoelectric plate 310 can correspond to piezoelectric plate 110 as described above with respect to FIG. 1. Similarly, the interleaved fingers 330 can correspond to interleaved fingers 236 as described above with respect to FIG. 1.

An RF voltage applied to the interleaved fingers 330 creates a time-varying electric field between the fingers. In the regions between the IDT fingers 330, the direction of the electric field is predominantly lateral, or parallel to the surface of the piezoelectric plate 310, and orthogonal to the length of the IDT fingers, as indicated by the dashed arrows labeled "electric field." Due to the high dielectric constant of the piezoelectric plate, the electric field is highly concentrated in the plate relative to the air. The lateral electric field excites acoustic waves in the piezoelectric plate 310. In an XBAR, the piezoelectric plate and the IDT are configured such that the lateral electric field causes shear deformation, and thus strongly excites shear-mode acoustic waves, in the piezoelectric plate 310. In this context, "shear deformation" is defined as deformation in which parallel planes in a material remain parallel and maintain a constant distance while translating relative to each other. "Shear acoustic waves" are defined as acoustic waves in a medium that result in shear deformation of the medium. The shear deformations in the piezoelectric plate 310 are represented by the curves 360, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3), the direction of acoustic energy flow of the primary shear acoustic mode is substantially orthogonal to the surface of the piezoelectric plate, as indicated by the arrow 365. Other secondary or spurious acoustic modes may also be excited in addition to the primary shear acoustic mode.

In other acoustic wave resonators using a similar configuration, the piezoelectric plate may be configured such that an RF signal applied to the IDT excites some other form of primary acoustic mode in which the direction of acoustic energy flow is substantially parallel to the surface of the piezoelectric plate.

An acoustic Bragg reflector 340 is sandwiched between the piezoelectric plate 310 and a substrate 320. The acoustic Bragg reflector 340 reflects the acoustic waves of the primary acoustic mode to keep the acoustic energy (i.e., arrow 365) predominantly confined to the piezoelectric plate 310. The acoustic Bragg reflector 340 for an XBAR is formed from alternating layers of materials having relatively high and relatively low acoustic impedance, with each layer having a thickness of about one-quarter of the wavelength of the shear acoustic waves (i.e., arrow 365) at resonance frequency of the XBAR 300. In the example of FIG. 3, the acoustic Bragg reflector 340 has a total of six layers. However, an acoustic Bragg reflector may have more than, or less than, six layers.

According to exemplary aspects, a dielectric or oxide layer can be provided on a solidly mounted XBAR that has a thickness that is equal to or greater than half lambda (i.e., a ≥λ/2 thick layer). In particular, the ≥λ/2 thick layer can be formed or otherwise disposed on the front surface of the piezoelectric plate and/or between the interleaved fingers of the IDTs, or on the back surface of the piezoelectric plate.

More particularly, FIG. 4A is an schematic cross-sectional view of an SM XBAR in a first aspect. As shown, an SM XBAR 400A is provided that incorporates a half-lambda dielectric layer on a surface of the piezoelectric plate that is opposite the aluminum IDT fingers. Specifically, FIG. 4A shows an SM XBAR 400A with a thick dielectric layer 420A on the back side (i.e., the side facing away from the IDT fingers) of a piezoelectric plate 410. The piezoelectric plate 410 may be a thin single-crystal layer of a piezoelectric material, such as lithium niobate. The piezoelectric plate 410 is cut such that the orientation of the X, Y, and Z crystalline axes with respect to the front and back surfaces of the piezoelectric plate 410 is known and consistent.

A comparable dielectric layer on the front side of the piezoelectric plate 410 could be used instead or in addition to the dielectric layer 420A. In particular, FIG. 4B is an schematic cross-sectional view of an SM XBAR in a refinement of the first aspect. As shown, an SM XBAR 400B is provided that incorporates a half-lambda dielectric layer on a surface of the piezoelectric plate that covers the aluminum IDT fingers. Specifically, SM XBAR 400A includes a thick dielectric layer 420B on the front side of the piezoelectric plate 410.

In either of the exemplary aspects of SM XBAR 400A or 400B, the ≥λ/2 thick layer (or greater) of $SiO_2$, as the dielectric, may be used to create a shear mode SM XBAR with ≥λ/2 $SiO_2$ layer on the back (e.g., 400A) or the front (e.g., 400B) of the piezoelectric (LN) plate. In some exemplary aspects, a dielectric material other than $SiO_2$ may be used such as silicon nitride or aluminum oxide. Moreover, as described in particular exemplary aspects below, the dielectric layer (either 402 or 420B) can have a thickness td that is defined as $0.85\lambda_{0,d} \leq 2td \leq 1.15\lambda_{0,d}$, where $\lambda_{0,d}$ is a wavelength of a fundamental shear bulk acoustic wave resonance in the half-lambda dielectric layer. Mor3eover, the thickness td of the half-lambda dielectric layer is in a direction normal (e.g., the vertical direction) to the surface of the substrate.

Figure 4C:
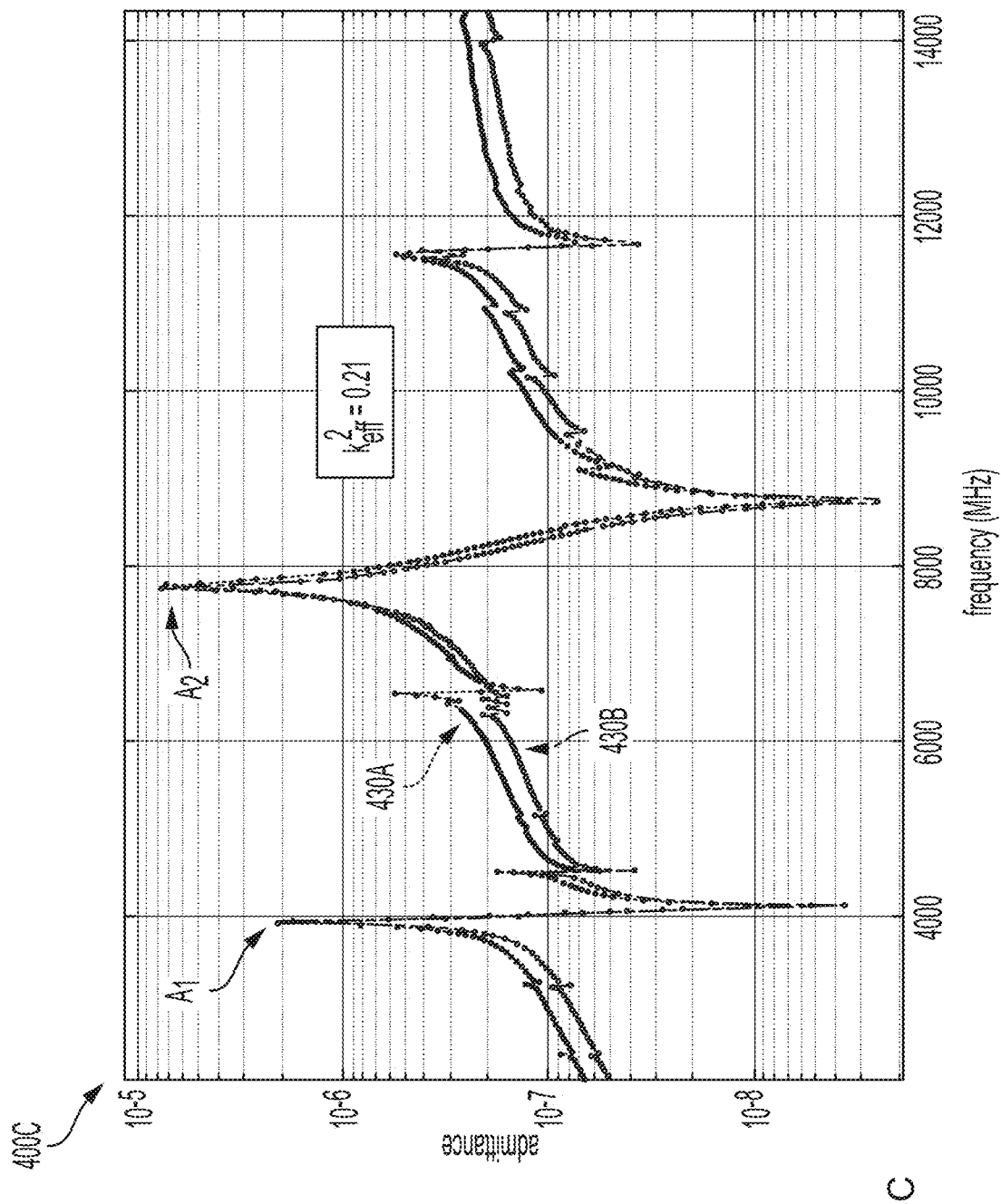
FIG. 4C is a chart of the admittance of the SM XBAR in the first exemplary aspects.

FIG. 4C is a chart 400C of the admittance of the SM XBAR in the first exemplary aspects predicted using a simulation model. In particular, SM XBAR 400B improves the temperature coefficient of frequency ("TCF") by providing the thick $SiO_2$ coating 420B on the front side of the piezoelectric plate 410. According to this configuration, the S2 mode becomes quite strongly coupled ($k^2$=0.21) and has good TCF. Curve 430A in the FIG. 4C illustrates the admittance for such a structure.

As also described above, X SM BAR 400A provides a similar structure in which a thick layer of $SiO_2$ 420A is disposed on the back-side of the piezoelectric plate 410. Curve 430B illustrates the admittance for SM XBAR 400A.

In both cases, the maximum coupling for the A2 mode occurs when the oxide is about (Vs $SiO_2$/Vs LN)*LN thickness, where Vs is the shear velocity of the material (i.e., the material of the dielectric and piezoelectric). In general, the (electromechanical) coupling is a coefficient that represents the conversion capability between electrical energy and mechanical energy, and the larger the value of this coefficient, the higher the conversion capability between electrical energy and mechanical energy.

In the simulation model of FIG. 4C, the piezoelectric plate 410 is 230 nm thick (in the Z direction) and the dielectric layer (either 420A or 420B) is 242 nm thick (in the Z direction). According to these configurations, the λ/2 thick layer (or greater) of dielectric configures a shear mode of a solidly mounted XBAR with λ/2 layer. Notably, the dielectric layer 420A of SM XBAR 400A provides a sufficient distance between the piezoelectric plate and metal layers required to make a Bragg reflector (not show), as will be discussed below. As a result, the dielectric layer 420A preserve the coupling (e.g., $k^2$=0.21).

Figure 4D:
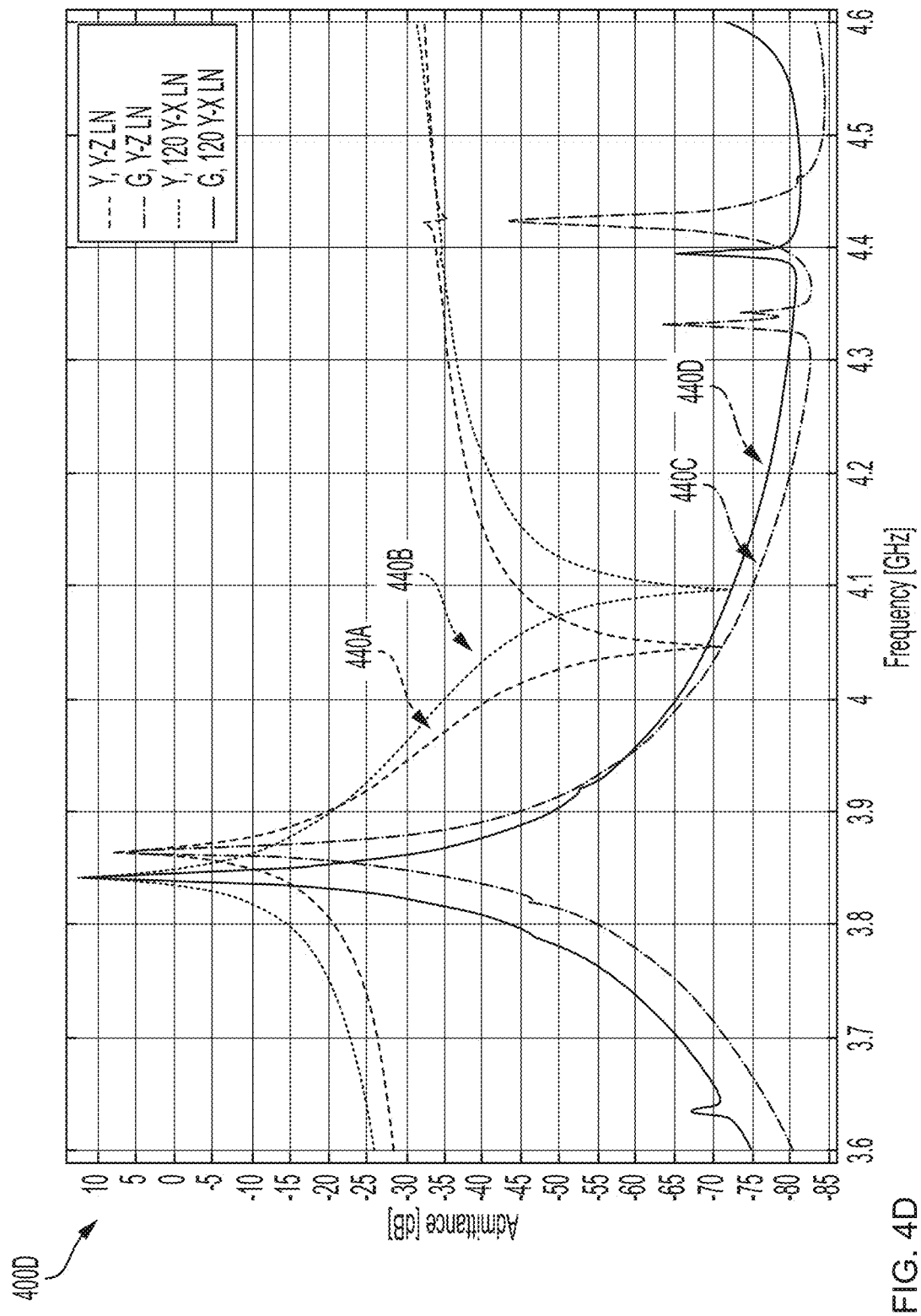
FIG. 4D is a chart of the admittance of the SM XBAR in the first exemplary aspects.

FIG. 4D is a chart of the admittance of the SM XBAR in the first exemplary aspects predicted using a simulation model. In general, the admittance chart illustrates a configuration as described above with respect to FIG. 4A with a dielectric layer (e.g., $SiO_2$) 420A between a piezoelectric plate 410 and a Bragg stack forming the solidly mounted XBAR. Specific implementations of the Bragg stack will be discussed in more detail below. In general, FIG. 4D is a chart 400D of the magnitude of the admittance of SM XBAR as a function of frequency.

The plots 440A and 440C shown in FIG. 4D are for an SM XBAR configuration that includes a stack having a Y-Z cut of piezoelectric plate of LN at 400 nm thickness and a dielectric below the piezoelectric plate of $SiO_2$ also at 400 nm thick. The Bragg stack includes three pairs of 150 nm W/200 nm $SiO_2$ layers. Moreover, IDT electrodes are aluminum and 100 nm thick.

Plots 440A and 440C illustrate admittance for an exemplary piezoelectric plate having lithium niobate (LN), a pitch of 3.5 µm, a mark to pitch ratio of 0.27, a resonance frequency of 3.865 GHz, an anti-resonance frequency of 4.047 GHz, with an R-aR of 4.5%. In particular, the admittance is plotted as Y (i.e., the quantity of admittance shown as plot 440A) and G (i.e., its constituent quantities of conductance, considered real(Y) and shown as plat 440C. The electromechanical coupling $K^2$ of SM XBAR for this simulated SM-XBAR configuration illustrated for plots 440B and 440D is 8.8%.

Plots 440B and 440D illustrate admittance for an exemplary piezoelectric plate having a 120 Y-X cut lithium niobate (LN), a pitch of 3.5 µm, a mark to pitch ratio of 0.27, a resonance frequency of 3.8425 GHz, an anti-resonance frequency of 4.0975 GHz, with an R-aR of 6.22%. In particular, the admittance is plotted as Y (i.e., the quantity of admittance shown as plot 440B) and G (i.e., its constituent quantities of conductance, considered real(Y) and shown as plat 440D). The electromechanical coupling $K^2$ of SM XBAR for this simulated SM-XBAR configuration illustrated for plots 440B and 440D is 12.06%. This configuration has a higher native SM XBAR K2 and thicker oxide than the configurations shown as plots 440A and 440C.

Figure 4E:
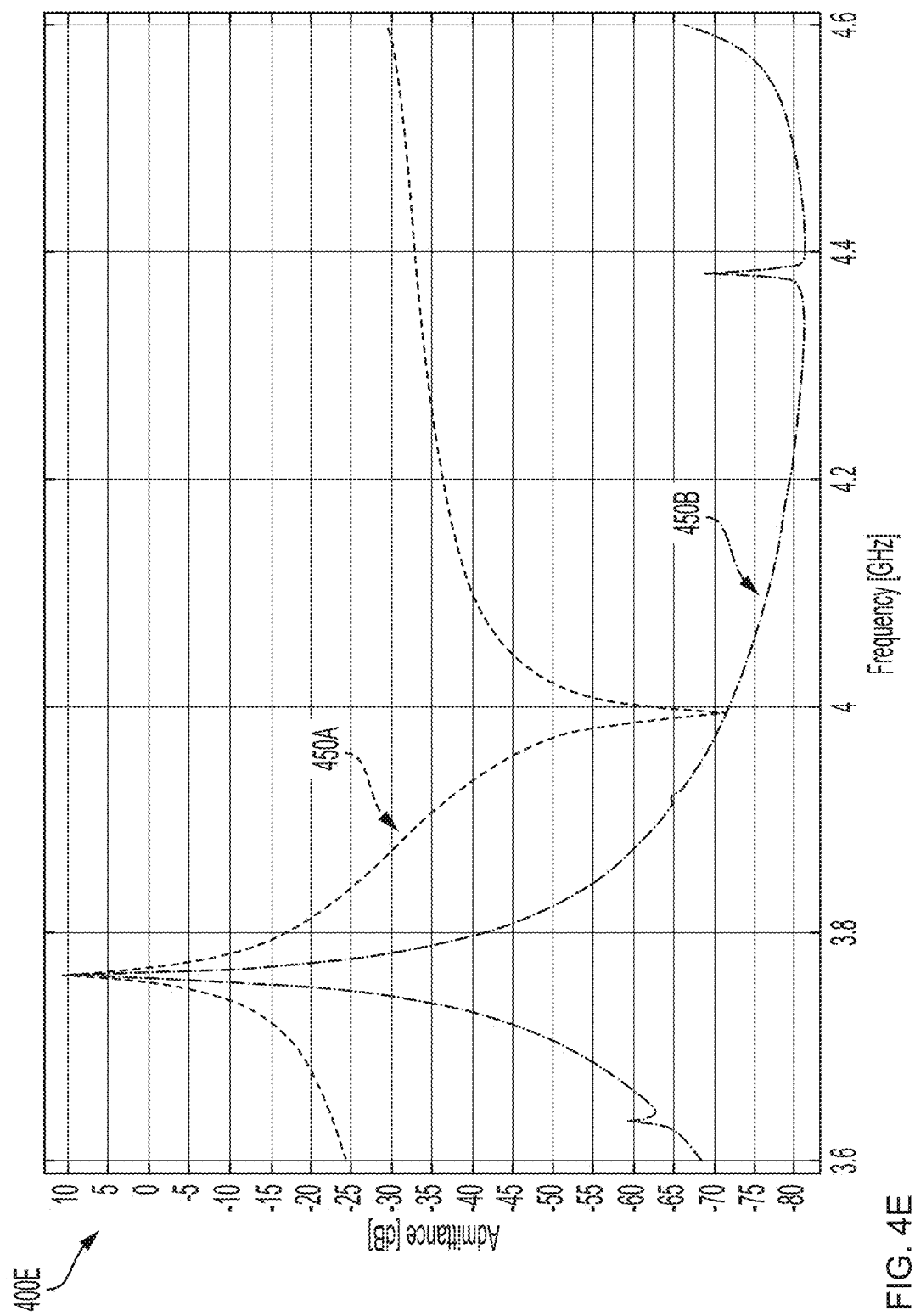
FIG. 4E is a chart of the admittance of the SM XBAR in the first exemplary aspects.

FIG. 4E is a chart of the admittance of the SM XBAR in the first exemplary aspects predicted using a simulation model. In general, the admittance chart illustrates a configuration as described above with respect to FIG. 4A with a dielectric layer (e.g., SiO$_2$) 420A between a piezoelectric plate 410 and a Bragg stack forming the solidly mounted XBAR.

FIG. 4E is a plot 400E of the magnitude of the admittance of SM XBAR as a function of frequency. The plot shown in FIG. 4E is for an SM XBAR configuration that includes a stack having a piezoelectric plate of LN at 400 nm thickness and a dielectric below the piezoelectric plate of SiO$_2$ also at 420 nm thick. The Bragg stack includes three pairs of 150 nm W/200 nm SiO$_2$ layers. Moreover, IDT electrodes are aluminum and 100 nm thick.

Plots 450A and 450B illustrate the piezoelectric plate in this example having 120 Y-X cut lithium niobate (LN), a pitch of 3.5 µm, a mark to pitch ratio of 0.27, a resonance frequency of 3.7625 GHz, an anti-resonance frequency of 3.995 GHz, with an R-aR of 5.82%. In particular, the admittance is plotted as Y (i.e., the quantity of admittance shown as plot 450A) and G (i.e., its constituent quantities of conductance, considered real(Y) and shown as plat 450B). Advantageously, the electromechanical coupling K$^2$ of SM XBAR illustrated for this simulated SM-XBAR configuration is 11.30%, which is relatively high compared with the configurations not having the half-lambda (or greater) dielectric layer.

Figure 4F:
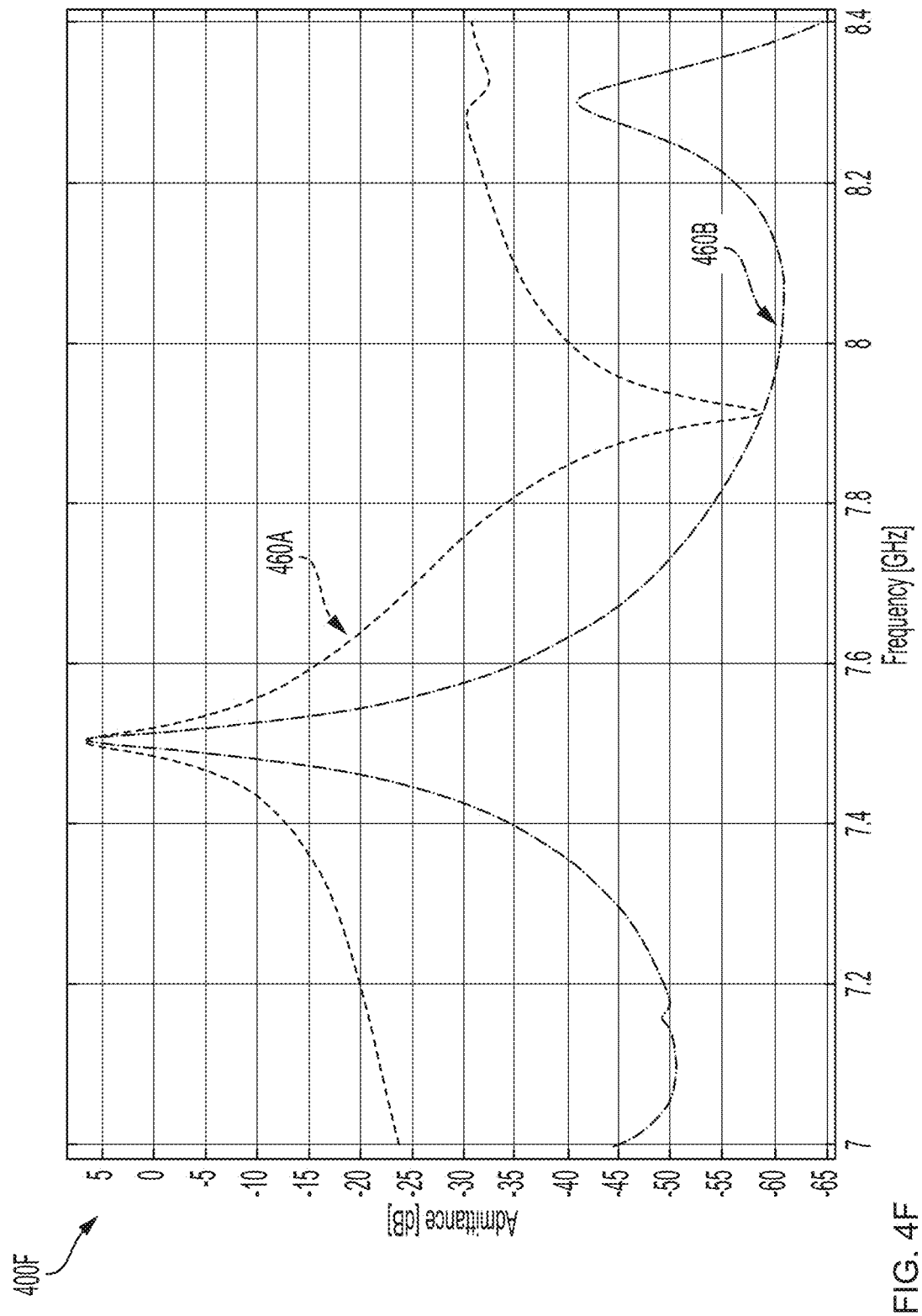
FIG. 4F is a chart of the admittance of the SM XBAR in the first exemplary aspects.

FIG. 4F is a plot 400F of the magnitude of the admittance of SM XBAR as a function of frequency operating in the 7 GHz-8 GHz range. The plot shown in FIG. 4F is for an SM XBAR configuration that includes a stack having a piezoelectric plate of LN at 215 nm thickness and a dielectric below the piezoelectric plate of SiO$_2$ also at 200 nm thick. The Bragg stack includes three pairs of 80 nm W/107 nm SiO$_2$ layers. Moreover, IDT electrodes are aluminum and 200 nm thick.

Plots 460A and 460B illustrate the piezoelectric plate in this example having 120 Y-X cut lithium niobate (LN), a pitch of 1.85 µm, a mark to pitch ratio of 0.25, a resonance frequency of 7.504 GHz, an anti-resonance frequency of 7.9135 GHz, with an R-aR of 5.172%. In particular, the admittance is plotted as Y (i.e., the quantity of admittance shown as plot 460A) and G (i.e., its constituent quantities of conductance, considered real(Y) and shown as plat 460B). Advantageously, the electromechanical coupling K$^2$ of SM XBAR illustrated for this simulated SM-XBAR configuration 10.1%, which is relatively high compared with the configurations not having the half-lambda (or greater) dielectric layer.

As described herein, the provision of a half-lambda (or greater) dielectric layer on the piezoelectric plate and sandwiched between a Bragg reflector having quarter-lambda dielectric layers provides for solidly mounted XBARs with improved electromechanical coupling. In addition, such acoustic resonator devices or filter devices formed of a plurality of these acoustic resonators also have a low temperature coefficient of frequency (TCF).

Thus, the configurations described herein with a half-lambda (or greater) dielectric layer on the piezoelectric plate also minimize the TCF consistent with the electromechanical coupling in the S$_2$ mode required to satisfy the bandwidth requirement of a filter. That is, the temperature performance of the SM XBAR devices described here are improved by applying the thick coating of a dielectric or oxide (e.g., SiO$_2$) to the top or bottom surface of the piezoelectric plate.

Referring back to FIG. 4B, if the coating thickness of the dielectric layer 420B is larger than the thickness of the electrode metal or IDT (i.e., the aluminum IDT fingers), the dielectric layer 420B may be polished to form a plane according to an exemplary aspect. Moreover, the mode of operation for such solidly mounted)(BARS is qualitatively different than a typical XBAR in that it is the S$_2$ (not A$_1$) mode (e.g., resonant or coupling mode) that becomes most strongly coupled, such as from the IDT to the piezoelectric plate. Advantageously, the TCF of the XBAR structure 400B of FIG. 4B is approximately 26 ppm/C compared with an estimated 70 ppm/C for a typical A$_1$ mode XBAR.

As also described above with respect to FIG. 4A, dielectric layer (e.g., SiO$_2$) 420A can also be placed on the backside of the piezoelectric plate 410. Again, the coating thickness of the dielectric layer 420A may also be polished on the bottom of the plate prior to bonding the plate to a substrate or Bragg reflector.

In either case, selecting the frontside or backside for the dielectric and selecting a proper dielectric thickness provide a maximum S$_2$ mode coupling and maximum TCF (e.g., minimum TCF value) for such solidly mounted XBAR structures. For both structures, the dielectric coating of dielectric layer (either 420A or 420B) that gives maximum coupling for the S$_2$ mode is approximately (Vs$_{coat}$/Vs$_{LN}$) *LN thickness, where Vs is the material shear velocity of the coating material (e.g., SiO$_2$) and the piezoelectric material (e.g., LN).

Figure 4G:
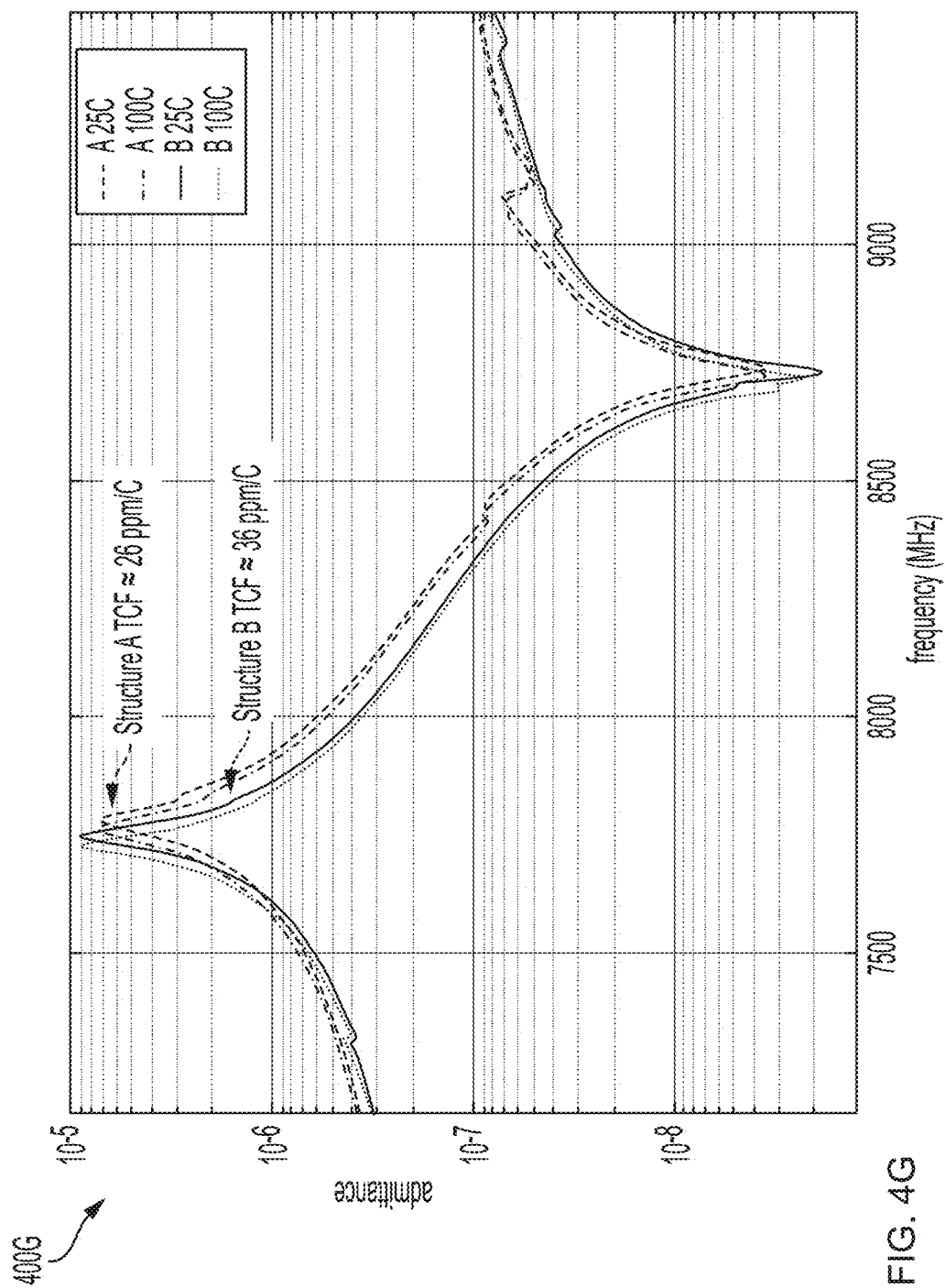
FIG. 4G is a chart of the admittance of the SM XBAR in the first exemplary aspects.

FIG. 4G is a chart 400G of the admittance of the SM XBAR in the first exemplary aspects predicted using a simulation model. The simulations shown are performed for each structure 400A and 400B at two different temperatures to demonstrate an improved TCF. In particular, structure A (i.e., the SM XBAR structure 400B of FIG. 4B) is demonstrated to have a TCF of approximately 26 ppm/C. The solid line represents the simulation at 25 degrees Celsius and the dashed line represents the simulation at 100 degrees Celsius. Similarly, structure B (i.e., the SM XBAR structure 400A of FIG. 4A) is demonstrated to have a TCF of approximately 36 ppm/C. Again, the solid line represents the simulation at 25 degrees Celsius and the dashed line represents the simulation at 100 degrees Celsius. In each case, the solidly mounted XBAR structures with the half-lambda (or greater) dielectric layer on the piezoelectric plate have improved TCF compared with typical XBAR structures without the thick dielectric layer.

Figure 4H:
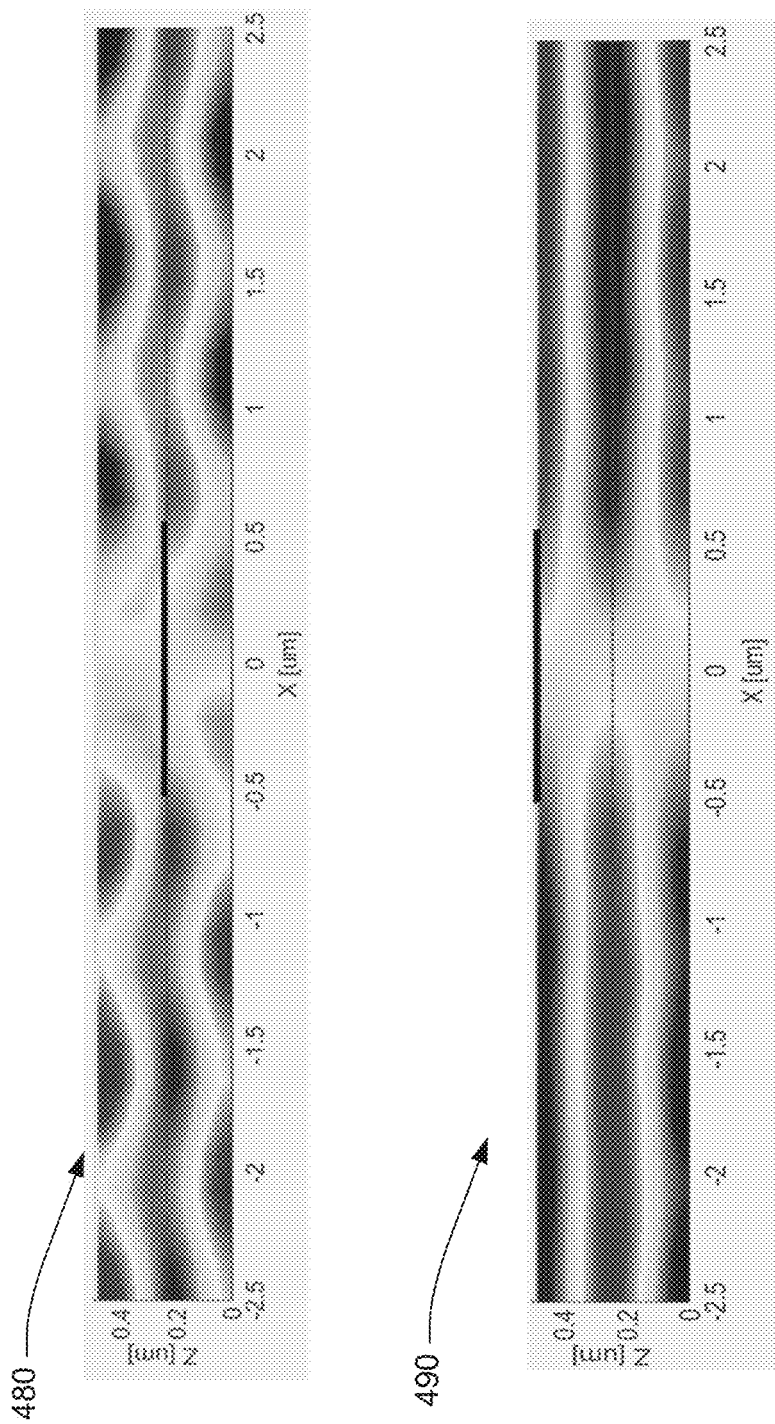
FIG. 4H are finite element method (FEM) simulations SM XBAR in the first exemplary aspects.
Figure 41:
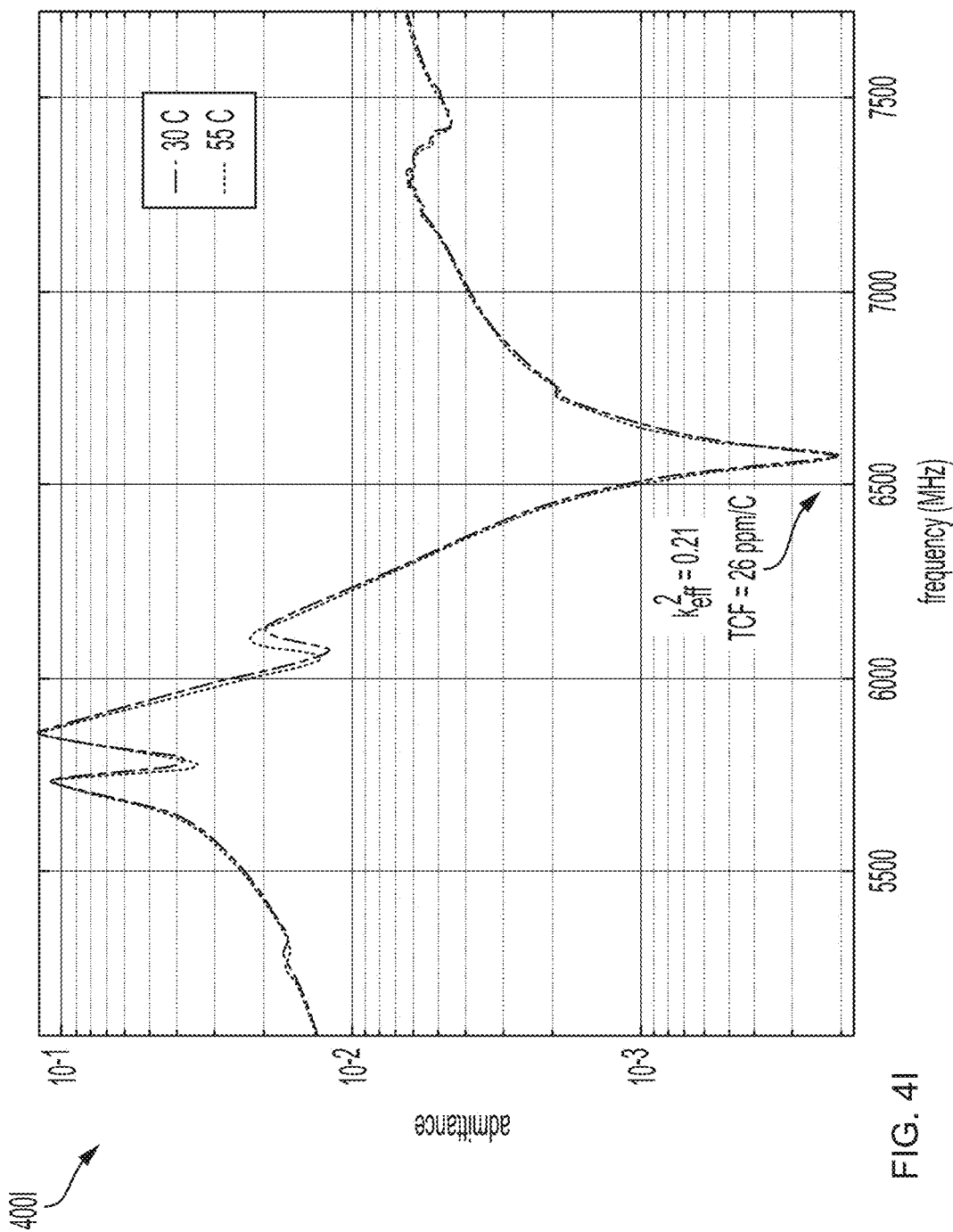

FIG. 4H are finite element method (FEM) simulations SM XBAR in the first exemplary aspects. In particular, two field displacements 480 and 490 are performed for structure A (i.e., the SM XBAR structure 400B of FIG. 4B) and structure B (i.e., the SM XBAR structure 400A of FIG. 4A) and performed at the resonant frequency to illustrate the u$_x$ field displacements. As illustrates, the simulations demonstrate an S$_2$ plate mode through the composite thickness of the piezoelectric plate (e.g., LN) and the dielectric layer (e.g., SiO$_2$).

FIG. 4I is a chart 400I of the admittance of the SM XBAR in the first exemplary aspects predicted using a simulation model. FIG. 4I illustrates a resonator measured at two temperatures, 30 and 55 C. As shown, the measured TCF of the anti-resonance is 26 ppm/C, which is a significant improvement compared to conventional XBAR without the half-lambda (or greater) dielectric layer on the piezoelectric plate. Moreover, the electro mechanical coupling k$^2$ is at least 0.21.

Figure 5A:
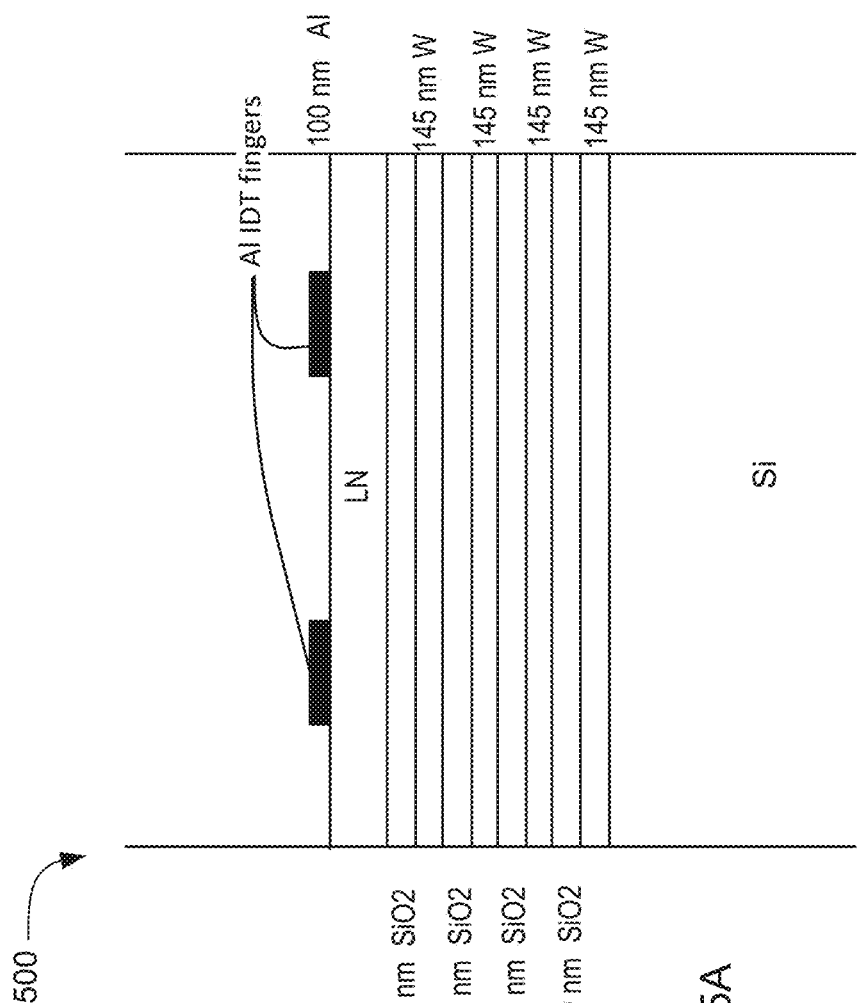
FIG. 5A is an expanded schematic cross-sectional view of an SM XBAR in a second aspect.

FIG. 5A is a schematic cross-sectional view of a SM XBAR 500 with an acoustic Bragg reflector including alternating low acoustic impedance and high acoustic impedance dielectric layers according to an exemplary aspect. The piezoelectric plate in this example is Z-Y-cut lithium niobate (LN) with a thickness of 400 nm. The Z-Y cut in the described aspect indicates that the LN is Z-cut and wave propagation occurs in the Y direction of the crystal coordinate. Accordingly, the ZY plane of the LN is located at a plate cross section that extends along the lateral wave propagation direction. The piezoelectric plate may be rotated Z-cut or rotated Y-cut LN. In such aspects, the piezoelectric plate would have either a rotated Z-cut or a rotated Y-cut crystal orientation.

In an exemplary aspect, the IDT fingers are aluminum with a thickness of 100 nm. The pitch of the IDT fingers is 4.05 µm and the mark-to-pitch ratio of the IDT fingers is 0.3, for example. The acoustic Bragg reflector has a total of eight layers. The low acoustic impedance layers are $SiO_2$ and 190 nm thick. The high acoustic impedance layers are W and are 145 nm thick. The substrate is silicon.

Figure 5B:
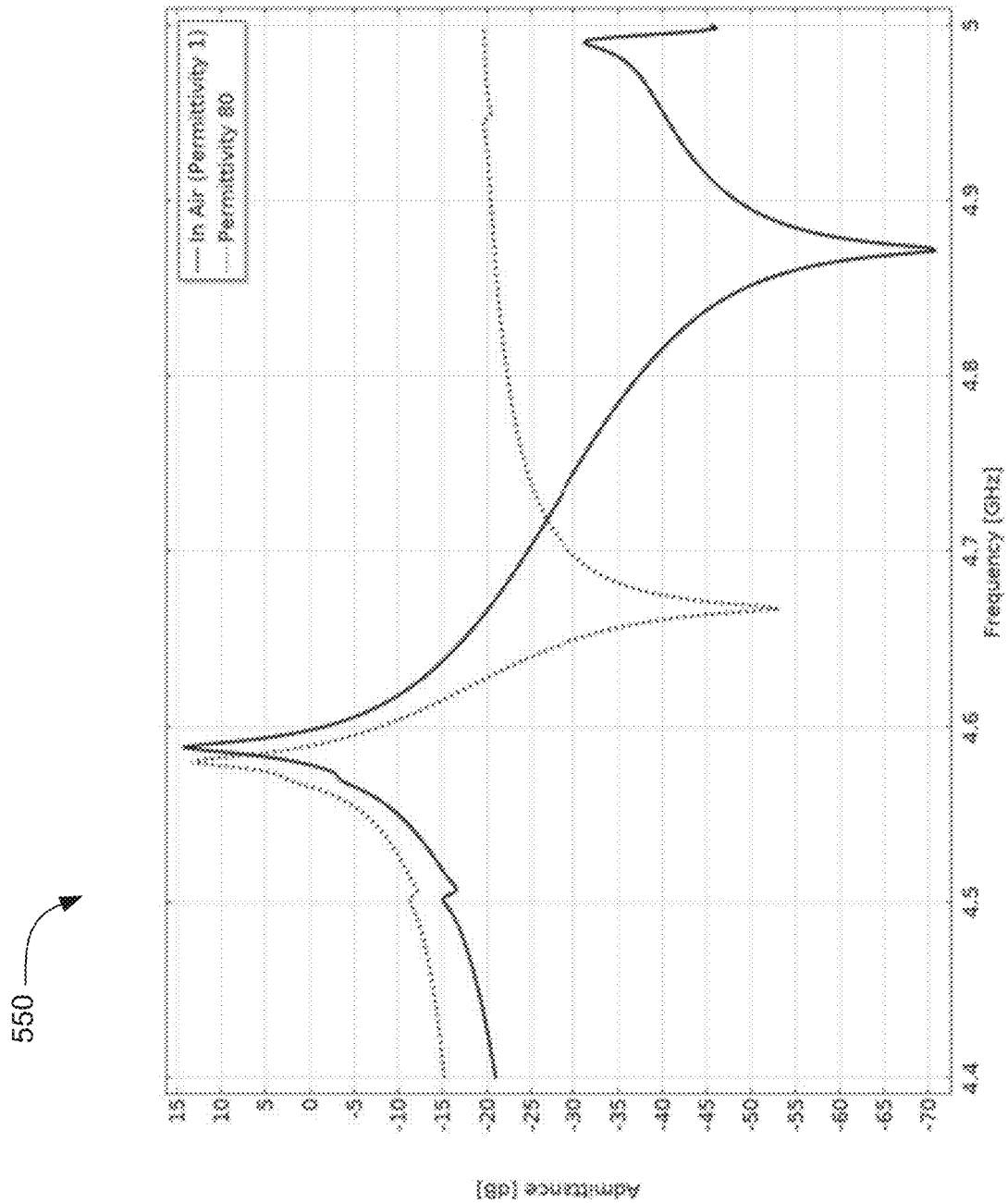
FIG. 5B is a chart of the admittance of the SM XBAR in the second aspect.

FIG. 5B is a plot 550 of the magnitude of the admittance of SM XBAR 500 of FIG. 5A as a function of frequency under two sensing environments. The solid curve in FIG. 5B represents the admittance of SM XBAR 500 in an environment having a permittivity that is approximately vacuum permittivity $\varepsilon_0$, such as permittivity of air. The dotted curve in FIG. 5B represents the admittance of SM XBAR 500 in a distilled water environment, having an approximate permittivity of $80\varepsilon_0$.

The electromechanical coupling $K^2$ of SM XBAR 500 operating in air (permittivity of approximately $\varepsilon_0$) is 14.3%, which is relatively high. However, $K^2$ of SM XBAR 500 falls to 4.6% when operating in the water environment (permittivity of $80\varepsilon_0$). Furthermore, $K^2$ of SM XBAR 500 under short circuit is 0%, indicating complete inoperability. The decreased coupling of SM XBAR 500 under liquid and short-circuit conditions indicates that SM XBAR 500 is less suitable for use in sensing applications in a liquid environment, due to the short-circuiting effect of the large dielectric permittivity of liquid, as well as liquid conductivity. However, the high coupling in an air environment indicates that SM XBAR 500 may be usable in a mass sensor application in a gas sensing environment.

Table 1 below describes the mass sensitivity of SM XBAR 500 in a gas sensing environment. The mass sensitivity is measured by applying layers of polymethyl methacrylate (PMMA) with incrementally increased thicknesses as an overlayer on the SM XBAR 500. At each thickness of PMMA, the resonance (Fr) and anti-resonance (Fa) frequencies of SM XBAR 500 are measured in order to determine a percentage of change in the resonance and anti-resonance frequencies in response to the increase in the PMMA thickness. The mass/area column in Table 1 describes the mass of the PMMA layer per area.

Table 1 indicates a change of 3% and 3.6% in the resonance and anti-resonance frequencies, respectively, in response to a thickness of 35 nm of PMMA, which is within acceptable parameters for mass sensing applications. Accordingly, SM XBAR 500 may be incorporated in a mass sensor, such as a gas sensor or a biosensor for example, that functions in non-liquid sensing conditions.

TABLE 1

| PMMA [nm] (overlayer) | Mass per area [µg/cm$^2$] | Fr [GHz] | ΔF/Fr | Fa [GHz] | ΔF/Fa |
|---|---|---|---|---|---|
| 0 | 0 | 4.5886 | 0% | 4.8721 | 0% |
| 15 | 1.785 | 4.54896 | −0.86% | 4.8285 | −0.89% |
| 25 | 2.975 | 4.5187 | −1.5% | 4.78415 | −1.8% |
| 35 | 4.165 | 4.484 | −3% | 4.6942 | −3.6% |

Figure 6A:
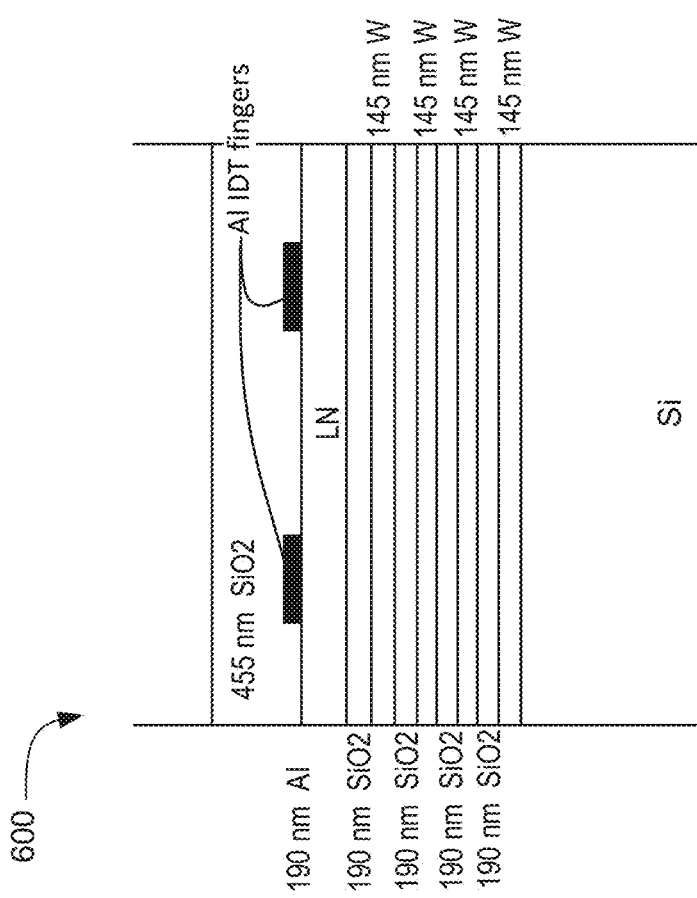
FIG. 6A is an expanded schematic cross-sectional view of an SM XBAR in a third aspect.

FIG. 6A is a schematic cross-sectional view of a SM XBAR 600 with an acoustic Bragg reflector including alternating low acoustic impedance and high acoustic impedance dielectric layers. The piezoelectric plate in this example is Z-Y-cut (i.e., Z-Y plane is normal to the plate) lithium niobate (LN) with a thickness of 400 nm. The piezoelectric plate may be rotated Z-cut or rotated Y-cut LN. The IDT fingers are aluminum with a thickness of 190 nm. The pitch of the IDT fingers is 3.9 µm and the mark-to-pitch ratio of the IDT fingers is 0.3. The acoustic Bragg reflector has a total of eight layers. The low acoustic impedance layers are $SiO_2$ and 190 nm thick. The high acoustic impedance layers are W and 145 nm thick. The substrate is silicon.

Figure 7:
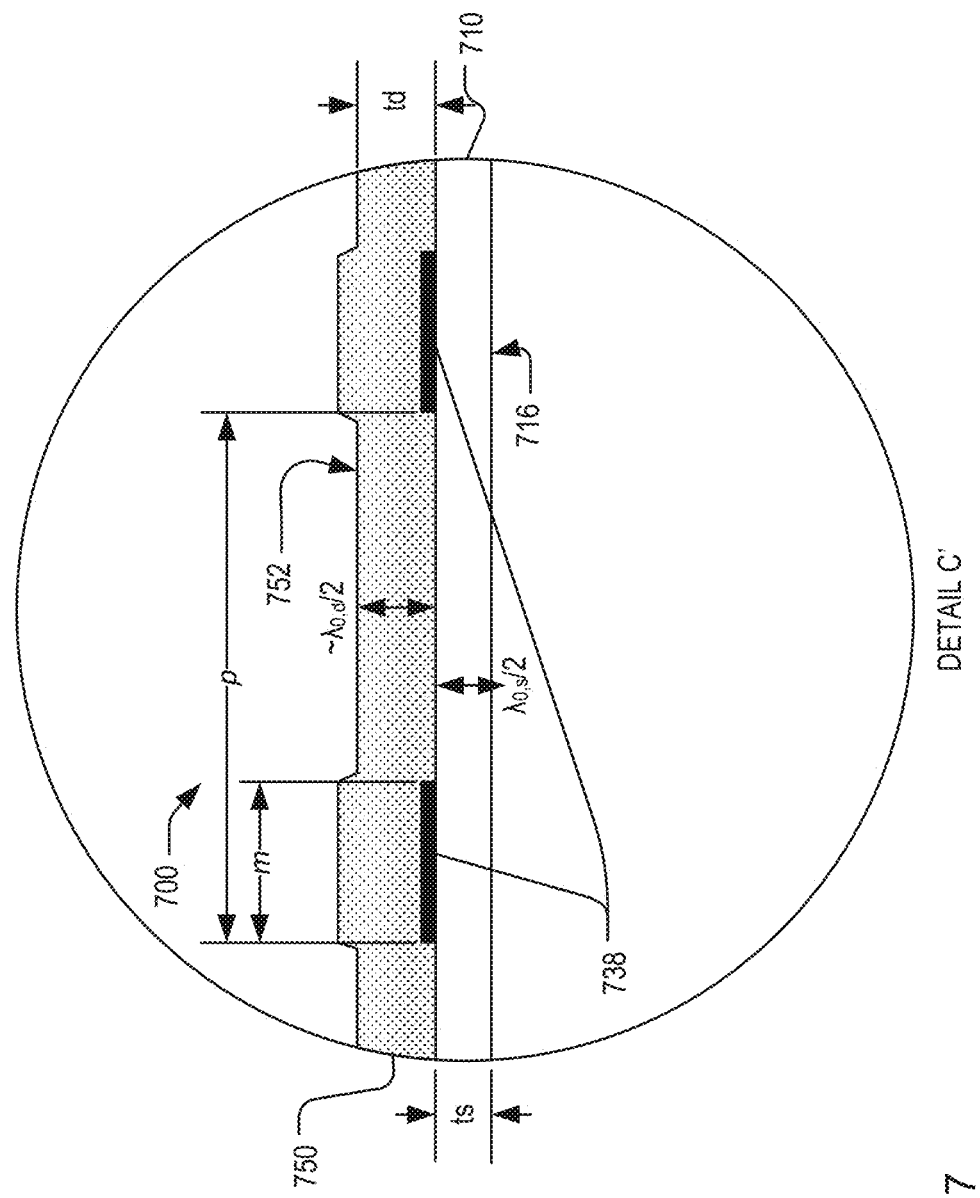
FIG. 7 is an expanded schematic cross-sectional view of an SM XBAR in the third aspect.

The structure of SM XBAR 600 of FIG. 6A differs from the structure of SM XBAR 500 of FIG. 5A by virtue of including a half-lambda dielectric layer covering the piezoelectric plate and the IDT fingers. The half-lambda dielectric layer of SM XBAR 600 is a $SiO_2$ overlayer 455 nm thick and the thickness of the IDT fingers is likewise increased to 190 nm to accommodate the overlayer. While $SiO_2$ is used as the overlayer in the SM XBAR 600, other dielectric materials may be used. FIG. 7 shows detail C' illustrating an aspect of the structure of the half-lambda dielectric overlayer.

In particular, FIG. 7 shows a detailed schematic cross-sectional view of an SM XBAR that incorporates a half-lambda dielectric layer. FIG. 7 specifically shows an SM XBAR 700 with a thick dielectric layer 750 on the front side (i.e., the side facing away from the substrate; the upper side as shown in FIG. 7) of a piezoelectric plate 710 and that is conformal with the interleaved fingers 738. A comparable dielectric layer on the back side 716 of the piezoelectric plate 710 could be used instead or in addition to the dielectric layer 750, as will be discussed in subsequent aspects. FIG. 7 also shows two IDT fingers 738 as previously described. Dimension p is the center-to-center spacing or "pitch" of the IDT fingers, and dimension m is the width or "mark" of the IDT fingers.

The piezoelectric plate 710 may be a thin single-crystal layer of a piezoelectric material such as lithium niobate or lithium tantalate. The piezoelectric plate 710 is cut such that the orientation of the X, Y, and Z crystalline axes with respect to the front and back surfaces of the piezoelectric plate 710 is known and consistent. The thickness ts of the piezoelectric plate 710 may be, for example, 100 nm to 1500 nm. In the aspect shown in FIG. 6A, the piezoelectric plate 710 is Z-Y cut lithium niobate that is 400 nm thick.

The dielectric layer 750 may be a dielectric material such as $SiO_2$, $Si_3N_4$, $Al_2O_3$, AlN or one or more other dielectric materials. In the aspect shown in FIG. 7, the dielectric layer 750 is $SiO_2$. As will be discussed, particular benefits may accrue when the dielectric material is or contains AlN and when the dielectric material is $SiO_2$.

The thickness ts of the piezoelectric plate 710 and the thickness td of the dielectric layer 750 are configured such that a shear bulk acoustic wave propagating normal to the surfaces 716 and 752 forms a full-cycle standing wave between the surfaces 716 and 752. That is, the thickness ts of the piezoelectric plate is (or is within a range of) one-half of $\lambda_{0,s}$, (2ts≈$\lambda_{0,s}$) which is the wavelength of the shear bulk acoustic wave fundamental resonance of the piezoelectric plate 710 in the absence of the dielectric layer 750. The thickness td of the dielectric layer 750 is (or is within a range of) one-half of $\lambda_{0,d}$, where $\lambda_{0,d}$ is the wavelength of the same bulk acoustic wave in the dielectric layer 750. In this case, each of the piezoelectric plate 710 and the dielectric layer 750 will contain a half cycle standing wave. $\lambda_{0,d}$ is equal to $\lambda_{0,s}$ times the ratio of the velocity of the shear acoustic wave in the dielectric layer 750 to the velocity of the shear acoustic wave in the piezoelectric plate 710. For a relatively slow dielectric material, such as $SiO_2$, $\lambda_{0,d}$ may be equal to or slightly less than $\lambda_{0,s}$. In this case, the thickness td of the dielectric layer 750 may be equal to or slightly less than ts. For a relatively fast dielectric material, such as $Si_3N_4$ or AlN, $\lambda_{0,d}$ may be substantially greater than $\lambda_{0,s}$. In this case, the thickness td of the dielectric layer 750 will be proportionally greater than ts.

While the dielectric layer 750 is referred to herein as a "half-lambda" dielectric layer, the thickness td of the dielectric layer need not be exactly $\lambda_{0,d}/2$. The thickness td may differ from $\lambda_{0,d}/2$ so long as the combined thicknesses of the piezoelectric plate 710 and the dielectric layer 750 are such that a second overtone resonance of the bulk shear wave occurs at a predetermined frequency. Simulation results show that dielectric layer thickness with a range defined by:

$$0.85\lambda_{0,d} \leq 2td \leq 1.15\lambda_{0,d} \quad (1)$$

results in XBARs with low spurious modes and consistent electromechanical coupling. Values of td outside of this range result in reduced electromechanical coupling and increased spurious modes. Likewise, the thickness ts of the piezoelectric plate need not be exactly one-half of $\lambda_{0,s}$. A range of thickness values based on $\lambda_{0,s}$ may be used for the thickness ts, depending for example on the characteristics of the wave generated in the piezoelectric plate and/or on additional passivation layers or other layers included in the resonator structure.

In FIG. 7, the dielectric layer 750 is shown deposited over and between the IDT fingers 738 and that is also conformal to the IDT fingers 738. In other aspects, a half-lambda dielectric layer may be formed only between the IDT fingers and/or planarized so that only a thin covering is over the top surface of the IDT fingers for passivation. However, in order to achieve electrical decoupling from the sensing environment as discussed below for liquid sensing applications, improved performance is achieved by depositing the dielectric layer over and between the IDT fingers, as shown in FIG. 7. The half-lambda dielectric layer 750 may be a single layer or two or more layers of different dielectric materials having similar acoustic impedances.

The temperature coefficient of frequency (TCF) of $SiO_2$ and the temperature coefficient of frequency of lithium niobate have similar magnitude and opposing signs. SM XBAR devices with an $SiO_2$ half-lambda dielectric layer will have substantially less frequency variation with temperature than conventional XBAR devices. Specifically, the TCF compensation afforded by use of the $SiO_2$ half-lambda dielectric layer is in the range of 20 ppm/K-30 ppm/K, in addition to TCF compensation of 20 ppm/K-30 ppm/K provided by the coefficient of thermal expansion (CTE) difference of Si and LN.

Simulation results show that a conventional XBAR device without a dielectric layer has a temperature coefficient of frequency around −113 ppm/C°. The presence of the $SiO_2$ half-lambda dielectric layer reduces the magnitude of the temperature coefficient of frequency by a factor of about 2.

Figure 6B:
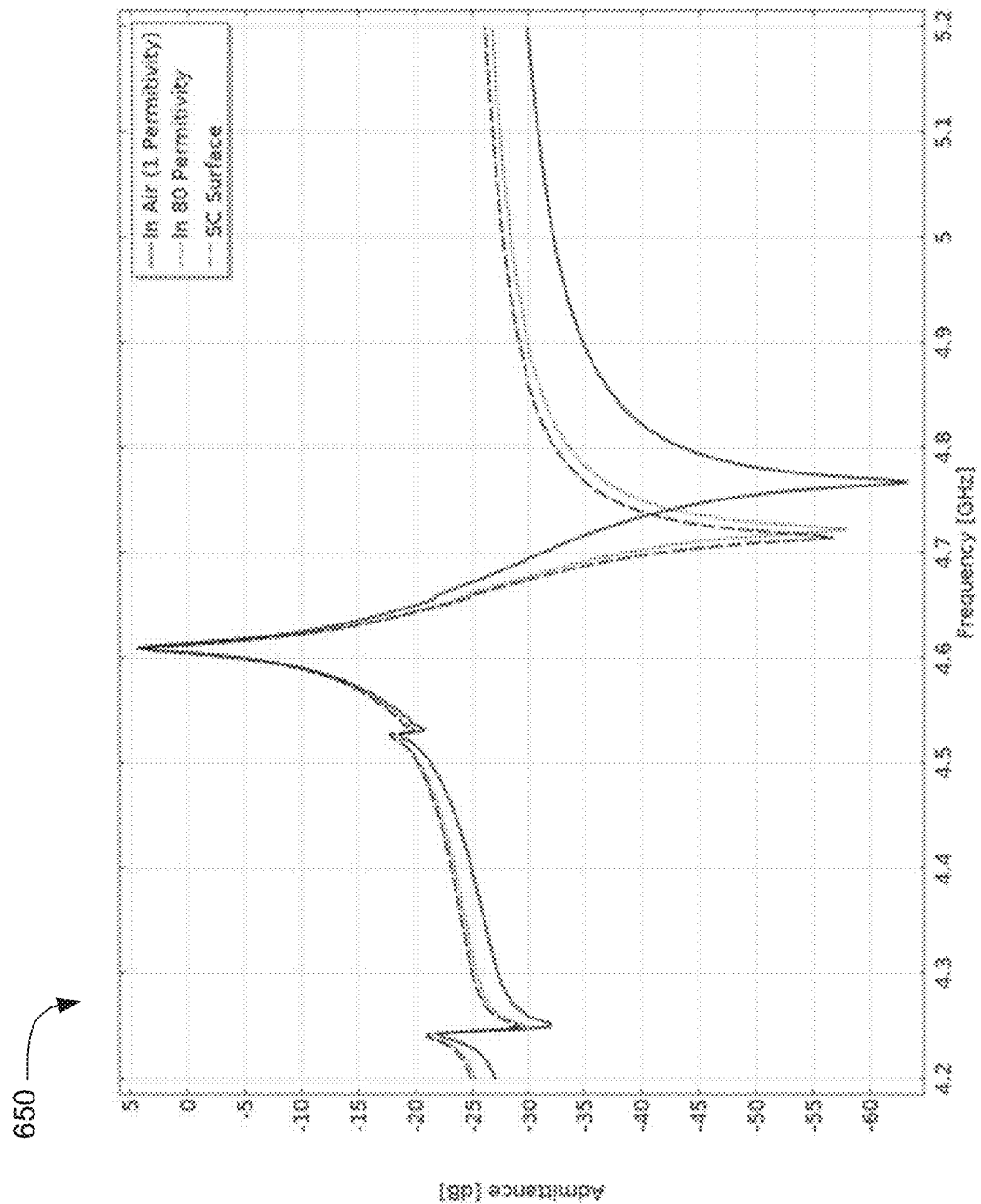
FIG. 6B is a chart of the admittance of the SM XBAR in the third aspect.

FIG. 6B is a plot 650 of the magnitude of the admittance of SM XBAR 600 of FIG. 6A as a function of frequency under three sensing environments. The solid curve in FIG. 6B represents the admittance of SM XBAR 600 in an environment having a permittivity that is approximately vacuum permittivity $\varepsilon_0$, such as permittivity of air. The dotted curve in FIG. 6B represents the admittance of SM XBAR 600 in a distilled water environment, having an approximate permittivity of $80\varepsilon_0$. The dashed curve in FIG. 6B represents the admittance of SM XBAR 600 when its surface is under short circuit.

The electromechanical coupling $K^2$ of SM XBAR 600 operating in air (permittivity of approximately $\varepsilon_0$) is 8.3%. $K^2$ of SM XBAR 600 maintains at 6.0% when operating in the water environment (permittivity of $80\varepsilon_0$). Furthermore, $K^2$ of SM XBAR 600 under short circuit is 5.4%.

The coupling values for SM XBAR 600 across the three sensing environments indicate the structure thereof is able to operate under electrical short-circuit surface conditions. Such capability is a pre-requisite for use in liquid sensing environments, including gin biosensing applications. Accordingly, the structure and performance of SM XBAR 600 makes this resonator suitable for such applications.

The $SiO_2$ half-lambda dielectric layer added to SM XBAR 600, with respect to SM XBAR 500, provides electrical decoupling of the resonator from its sensing environment. Accordingly, the $SiO_2$ half-lambda dielectric layer disposed over the piezoelectric plate in SM XBAR 600 renders this structure more suitable for liquid sensing applications.

Furthermore, as discussed above, use of $SiO_2$ as the dielectric layer in combination with lithium niobate achieves TCF compensation and reduces the temperature sensitivity of the structure due to the matching and opposite TCF values of $SiO_2$ and lithium niobate. Finally, simulations show that the anti-resonance of SM XBAR 600 shows sensitivity in the range of −119 ppm/$\varepsilon_0$.

Table 2 below describes the mass sensitivity of SM XBAR 600 in a gas sensing environment. As discussed above with reference to Table 1, the mass sensitivity is measured by applying layers of polymethyl methacrylate (PMMA) with incrementally increased thicknesses as an overlayer on the SM XBAR 600.

Table 2 indicates a change of 2% and 2.17% in the resonance and anti-resonance frequencies, respectively, in response to a thickness of 35 nm of PMMA, which is within acceptable parameters for mass sensing applications. Accordingly, SM XBAR 600 may be incorporated in a mass sensor, such as a gas sensor or a biosensor for example, both under gas and liquid sensing conditions.

TABLE 2

| PMMA [nm] (overlayer) | Mass per area [μg/cm$^2$] | Fr [GHz] | ΔF/Fr | Fa [GHz] | Δ/Fa |
|---|---|---|---|---|---|
| 0 | 0 | 4.6099 | 0% | 4.7674 | 0% |
| 15 | 1.785 | 4.5792 | −0.666% | 4.736 | −0.66% |
| 25 | 2.975 | 4.5546 | −1.2% | 4.7104 | −1.2% |
| 35 | 4.165 | 4.5182 | −2% | 4.664 | −2.17% |

Figure 8A:
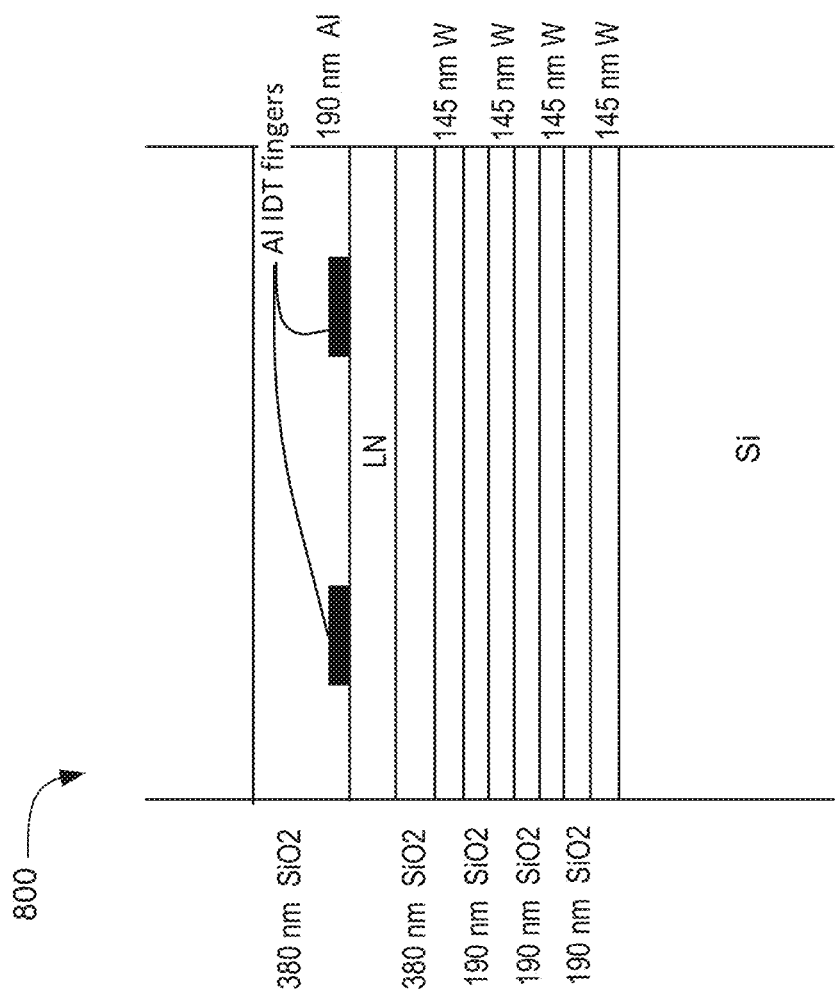
FIG. 8A is an expanded schematic cross-sectional view of an SM XBAR in a fourth aspect.

FIG. 8A is a schematic cross-sectional view of a SM XBAR 800 with an acoustic Bragg reflector including alternating low acoustic impedance and high acoustic impedance dielectric layers. The piezoelectric plate in this example is Z-Y-cut (i.e., Z-Y plane is normal to the plate) lithium niobate (LN) with a thickness of 400 nm. The piezoelectric plate may be rotated Z-cut or rotated Y-cut LN. The IDT fingers are aluminum with a thickness of 190 nm. The pitch of the IDT fingers is 3.9 μm and the mark-to-pitch ratio of the IDT fingers is 0.3. The acoustic Bragg reflector has a total of seven layers. The low acoustic impedance layers are $SiO_2$ and 190 nm thick, while the high acoustic impedance layers are W and 145 nm thick. The substrate is silicon.

The structure of SM XBAR 800 of FIG. 8A differs from the structure of SM XBAR 600 of FIG. 6A by virtue of including two half-lambda dielectric layers—one covering the piezoelectric plate and the IDT fingers as in SM XBAR 600 and another one directly below the piezoelectric plate.

The half-lambda dielectric layer below the piezoelectric plate is SiO$_2$ with a thickness of 380 nm.

The half-lambda dielectric layer of SM XBAR 800 above the piezoelectric plate is a SiO$_2$ overlayer 380 nm thick and the thickness of the IDT fingers is increased to 190 nm to accommodate the overlayer, as in SM XBAR 600. While SiO$_2$ is used as the half-lambda dielectric layers in the SM XBAR 800, other dielectric materials may be used. For example, each of the two the half-lambda dielectric layers of SM XBAR 800 may be a dielectric material such as SiO$_2$, Si$_3$N$_4$, Al$_2$O$_3$, AlN or one or more other dielectric materials. However, as noted above, thermal compensation benefits may accrue when the dielectric material is or contains SiO$_2$.

As described above with respect to SM XBAR 600, the thickness of each of the two half-lambda dielectric layers in SM XBAR 800 is one-half of $\lambda_{0,d}$, where $\lambda_{0,d}$ is the wavelength of the bulk acoustic wave in the respective dielectric layer. In this case, because both half-lambda dielectric layers in SM XBAR 800 are composed of SiO$_2$, the thickness of the layers is the same because the wavelength of the bulk acoustic wave in each of the layers is the same since they are of the same material. Other aspects in which the two half-lambda dielectric layers above and below the piezoelectric plate are made of different materials may result in different thicknesses for each respective half-lambda dielectric layer.

While the dielectric layers are referred to herein as a "half-lambda" dielectric layers, the thickness of each dielectric layer need not be exactly $\lambda_{0,d}/2$. As discussed above with respect to SM XBAR 600, the thickness of the dielectric layer may differ from $\lambda_{0,d}/2$ so long as the combined thicknesses of the piezoelectric plate and the dielectric layers are such that a second overtone resonance of the bulk shear wave occurs at a predetermined frequency. As indicated by Equation (1) above, a range of ±15% of $\lambda_{0,d}/2$ for the thickness of the dielectric layers results in XBARs with low spurious modes and consistent electromechanical coupling.

As with the SM XBAR 600, the SiO$_2$ half-lambda dielectric layer above the piezoelectric plate in SM XBAR 800 provides electrical decoupling of the resonator from its sensing environment, as well as TCF compensation due to the interface between SiO$_2$ and lithium niobate. The addition of another half-lambda dielectric layer below the piezoelectric plate in SM XBAR 800 further contributes to the TCF compensation due to another interface between SiO$_2$ and lithium niobate below the plate.

Another benefit of the half-lambda dielectric layer below the piezoelectric plate in SM XBAR 800 is the movement of the W high impedance layers farther from the piezoelectric plate. As compared with SM XBAR 600, the additional thickness of the half-lambda SiO$_2$ layer below the piezoelectric plate moves the conductive W layers of the Bragg reflector farther from the piezoelectric plate in SM XBAR 800. Increasing the distance between the piezoelectric plate and the nearest metal layer in the Bragg reflector helps retain the electromechanical coupling factor.

Figure 8B:
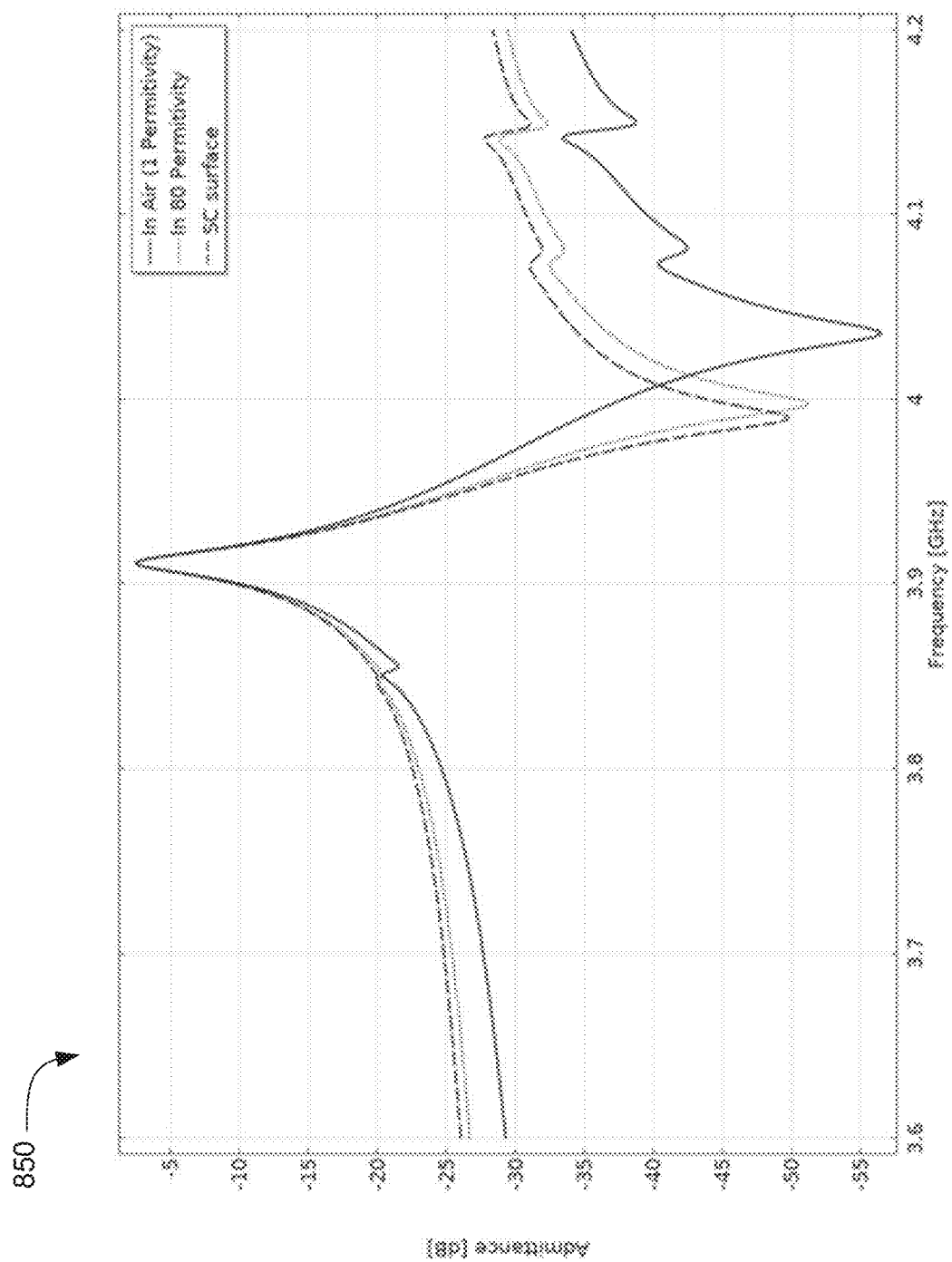
FIG. 8B is a chart of the admittance of the SM XBAR in the fourth aspect.

FIG. 8B is a plot 850 of the magnitude of the admittance of SM XBAR 800 of FIG. 8A as a function of frequency under three sensing environments. The solid curve in FIG. 8B represents the admittance of SM XBAR 800 in an environment having a permittivity that is approximately vacuum permittivity $\epsilon_0$, such as permittivity of air. The dotted curve in FIG. 8B represents the admittance of SM XBAR 800 in a distilled water environment, having an approximate permittivity of 80$\epsilon_0$. The dashed curve in FIG. 8B represents the admittance of SM XBAR 800 when its surface is under short circuit.

The electromechanical coupling K$^2$ of SM XBAR 800 operating in air (permittivity of approximately $\epsilon_0$) is 7.6%. K$^2$ of SM XBAR 800 maintains at 5.3% when operating in the water environment (permittivity of 80$\epsilon_0$). Furthermore, K$^2$ of SM XBAR 600 under short circuit is 4.85%.

The coupling values for SM XBAR 800 across the three sensing environments indicate that the structure thereof is able to operate under electrical short-circuit surface conditions. Such capability is a pre-requisite for use in liquid sensing environments, including gin biosensing applications. Accordingly, the structure and performance of SM XBAR 800 makes this resonator suitable for such applications.

As in SM XBAR 600, the SiO$_2$ half-lambda dielectric layer above the piezoelectric plate provides electrical decoupling of the resonator from its sensing environment. Accordingly, the SiO$_2$ half-lambda dielectric layer disposed over the piezoelectric plate in SM XBAR 800 also renders this structure more suitable for liquid sensing applications.

Table 3 below describes the mass sensitivity of SM XBAR 800 in a gas sensing environment. As discussed above with reference to Table 1, the mass sensitivity is measured by applying layers of polymethyl methacrylate (PMMA) with incrementally increased thicknesses as an overlayer on the SM XBAR 800.

Table 3 indicates a change of 2.4% and 2.8% in the resonance and anti-resonance frequencies, respectively, in response to a thickness of 35 nm of PMMA, which is within acceptable parameters for mass sensing applications. In fact, the mass sensitivity of SM XBAR 800 is slightly better than SM XBAR 600 while providing the same electrical decoupling from the sensing environment. Accordingly, SM XBAR 800 may be incorporated in a mass sensor, such as a gas sensor or a biosensor for example, both under gas and liquid sensing conditions.

TABLE 3

| PMMA [nm] (overlayer) | Mass per area [μg/cm$^2$] | Fr [GHz] | ΔF/Fr | Fa [GHz] | Δ/Fa |
|---|---|---|---|---|---|
| 0 | 0 | 3.9117 | 0% | 4.0356 | 0% |
| 15 | 1.785 | 3.8769 | −0.9% | 3.9946 | −1% |
| 25 | 2.975 | 3.85025 | −1.6% | 3.9624 | −1.8% |
| 35 | 4.165 | 3.81693 | −2.4% | 3.92135 | −2.8% |

Figure 9A:
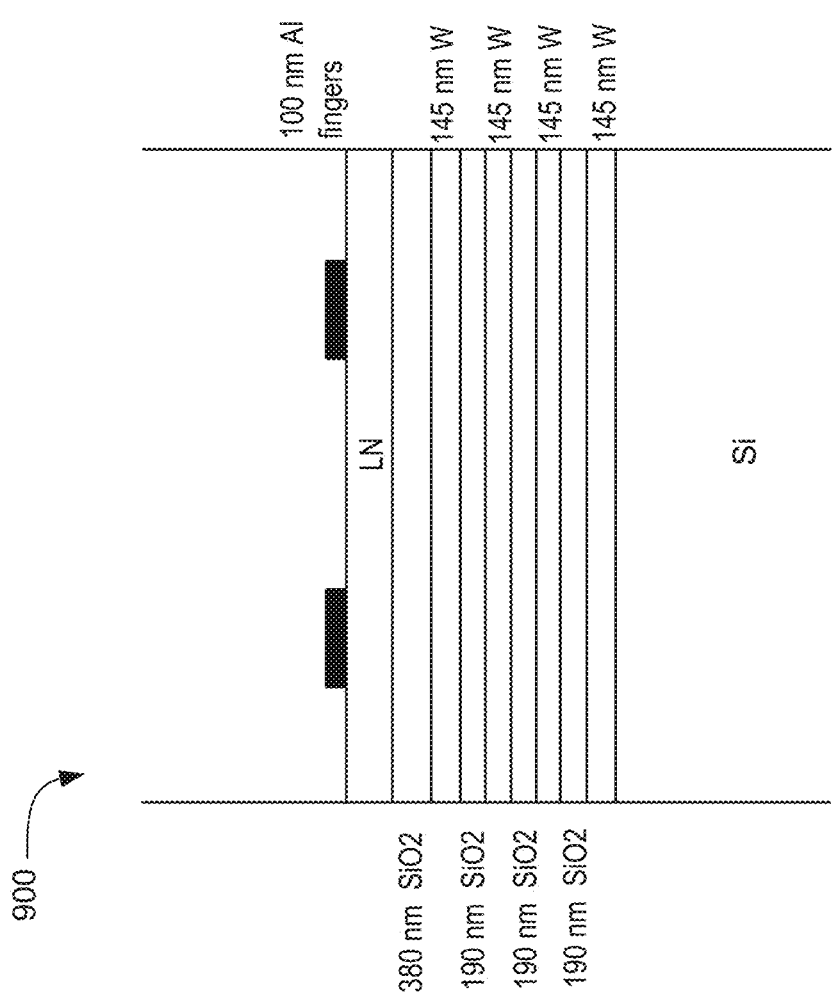
FIG. 9A is an expanded schematic cross-sectional view of an SM XBAR in a fifth aspect.

FIG. 9A is a schematic cross-sectional view of a SM XBAR 900 with an acoustic Bragg reflector including alternating low acoustic impedance and high acoustic impedance dielectric layers. The piezoelectric plate in this example is Z-Y-cut (i.e., Z-Y plane is normal to the plate) lithium niobate (LN) with a thickness of 400 nm. The piezoelectric plate may be rotated Z-cut or rotated Y-cut LN. The IDT fingers are aluminum with a thickness of 100 nm. The pitch of the IDT fingers is 3.5 μm and the mark-to-pitch ratio of the IDT fingers is 0.3. The acoustic Bragg reflector has a total of seven layers. The low acoustic impedance layers are SiO$_2$ and 190 nm thick, while the high acoustic impedance layers are W and 145 nm thick. The substrate is silicon.

The structure of SM XBAR 900 of FIG. 9A differs from the structure of SM XBAR 800 of FIG. 8A by virtue of omitting the half-lambda dielectric layer covering the piezoelectric plate and the IDT fingers and only including the half-lambda dielectric layer directly below the piezoelectric plate. The half-lambda dielectric layer below the piezoelectric plate is $SiO_2$ with a thickness of 380 nm.

While $SiO_2$ is used as the half-lambda dielectric layer in the SM XBAR 900, other dielectric materials may be used. For example, the half-lambda dielectric layer of SM XBAR 900 may be a dielectric material such as $SiO_2$, $Si_3N_4$, $Al_2O_3$, AlN or one or more other dielectric materials. However, as noted above, thermal compensation benefits may accrue when the dielectric material is or contains $SiO_2$.

As described above with respect to SM XBAR 800, the thickness of the half-lambda dielectric layer in SM XBAR 900 is one-half of $\lambda_{0,d}$, where $\lambda_{0,d}$ is the wavelength of the bulk acoustic wave in the dielectric layer. While the dielectric layer is referred to herein as a "half-lambda" dielectric layer, the thickness of the dielectric layer need not be exactly $\lambda_{0,d}/2$. As discussed above with respect to SM XBAR 800, the thickness of the dielectric layer may differ from $\lambda_{0,d}/2$ so long as the combined thicknesses of the piezoelectric plate and the dielectric layers are such that a second overtone resonance of the bulk shear wave occurs at a predetermined frequency. As indicated by Equation (1) above, a range of ±15% of $\lambda_{0,d}/2$ for the thickness of the dielectric layer results in XBARs with low spurious modes and consistent electromechanical coupling.

Unlike in SM XBAR 800, SM XBAR 900 lacks the $SiO_2$ half-lambda dielectric layer above the piezoelectric plate that provides electrical decoupling of the resonator from its sensing environment. However, the half-lambda dielectric layer below the piezoelectric plate still provides TCF compensation due to the interface between $SiO_2$ and lithium niobate.

As in SM XBAR 800, the half-lambda dielectric layer below the piezoelectric plate in SM XBAR 900 moves the W high impedance layers farther from the piezoelectric plate. The increased distance between the piezoelectric plate and the nearest metal layer in the Bragg reflector retains the electromechanical coupling factor.

Figure 9B:
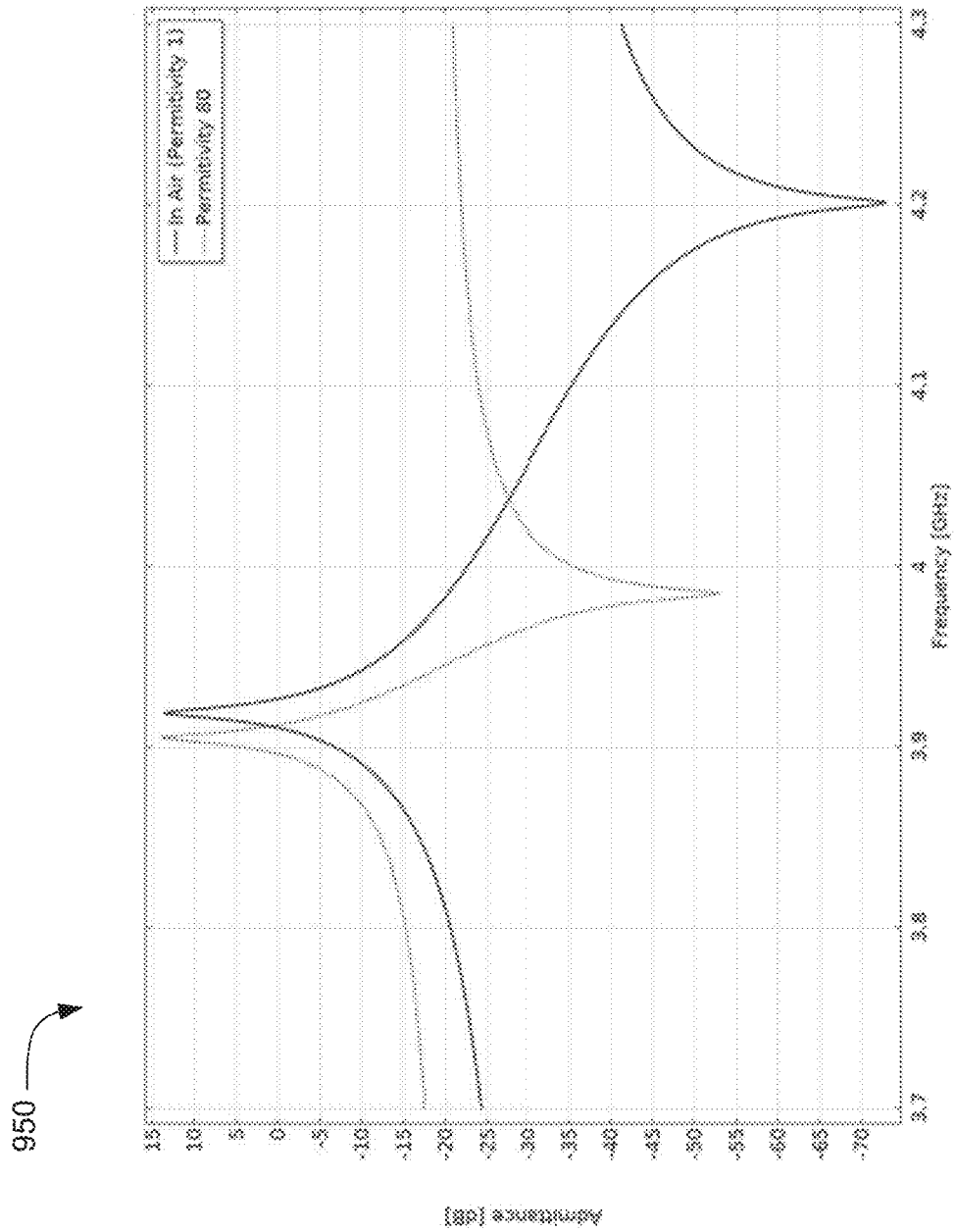
FIG. 9B is a chart of the admittance of the SM XBAR in the fifth aspect.

FIG. 9B is a plot 950 of the magnitude of the admittance of SM XBAR 900 of FIG. 9A as a function of frequency under two sensing environments. The solid curve in FIG. 9B represents the admittance of SM XBAR 900 in an environment having a permittivity that is approximately vacuum permittivity $\varepsilon_0$, such as permittivity of air. The dotted curve in FIG. 9B represents the admittance of SM XBAR 900 in a distilled water environment, having an approximate permittivity of $80\varepsilon_0$.

The electromechanical coupling $K^2$ of SM XBAR 900 operating in air (permittivity of approximately $\varepsilon_0$) is 16.6%. $K^2$ of SM XBAR 900 drops to 4.9% when operating in the water environment (permittivity of $80\varepsilon_0$). Furthermore, $K^2$ of SM XBAR 900 under short circuit is 0%, indicating inoperability. The decreased coupling of SM XBAR 900 under liquid and short-circuit conditions indicates that SM XBAR 900 is less suitable for use in sensing applications in a liquid environment, due to the short-circuiting effect of the large dielectric permittivity of liquid, as well as liquid conductivity. However, the high coupling in an air environment indicates that SM XBAR 900 may be more usable in a mass sensor application in a gas sensing environment.

Table 4 below describes the mass sensitivity of SM XBAR 900 in a gas sensing environment. As discussed above with reference to Table 1, the mass sensitivity is measured by applying layers of polymethyl methacrylate (PMMA) with incrementally increased thicknesses as an overlayer on the SM XBAR 900.

Table 4 indicates a change of 1.7% and 1.3% in the resonance and anti-resonance frequencies, respectively, in response to a thickness of 35 nm of PMMA, which is a lower sensitivity than previously discussed aspects. However, depending on system requirements, SM XBAR 900 may be incorporated in a mass sensor, such as a gas sensor or a biosensor that functions under gas sensing conditions.

TABLE 4

| PMMA [nm] (overlayer) | Mass per area [μg/cm²] | Fr [GHz] | ΔF/Fr | Fa [GHz] | Δ/Fa |
| --- | --- | --- | --- | --- | --- |
| 0 | 0 | 3.91895 | 0% | 4.20112 | 0% |
| 15 | 1.785 | 3.89705 | −0.55% | 4.18515 | −0.4% |
| 25 | 2.975 | 3.87875 | −1.0% | 4.17075 | −0.7% |
| 35 | 4.165 | 3.8524 | −1.7% | 4.1471 | −1.3% |

As discussed above, the SM XBAR structures 500 and 900 are not as suitable for in-liquid sensing as SM XBAR structures 600 and 800. Additionally, as compared to SM XBAR 500, SM XBAR 900 has a lower TCF due to the TCF compensation provided by the bottom-side half-lambda dielectric layer present in SM XBAR 900, but not in SM XBAR 500. However, the tolerance of the resonance frequency in sensing applications is not always critical, as relative frequency shift is the sensing parameter. That is, in cases of insufficient TCF compensation, a reference sensor that is exposed to the same temperature, but is not exposed to the measurand, is used to calibrate the actual sensor.

On the other hand, SM XBAR structures 600 and 800 are suitable for gas and in-liquid sensing applications, where SM XBAR 600 has moderate coupling and lower-loss performance than SM XBAR 800 due to the use of only one half-lambda dielectric layer. Despite the structural and performance differences among SM XBARs 500, 600, 800, and 900, each of these aspects are shear-mode XBARs that are solidly mounted on Bragg reflectors, and, as such, have good Q factors and high sensitivity to mass loading. Accordingly, each of SM XBARs 500, 600, 800, and 900 may be used to implement mass sensors.

Specifically, high-frequency sensor applications (e.g., above 5 GHz) may be a good fit for using one of SM XBARs 500, 600, 800, and 900, as the disclosed structure of SM XBARs 500, 600, 800, and 900 indicates improved performance and smaller size, making the SM XBARs 500, 600, 800, and 900 useful for compact operation and arrayed design. In addition, the shear orientation of the acoustic waves in XBARs allows the disclosed structures to retain their performance when immersed in liquid as energy confinement is within about 30 nm of the sensing surface. This is because shear waves do not exist in liquid and liquid viscosity leads to shear waves to decay quickly in the liquid. As such, use of shear-mode resonators like SM XBARs 600 and 800 is advantageous in liquid environments, especially in the GHz range.

Figure 10:
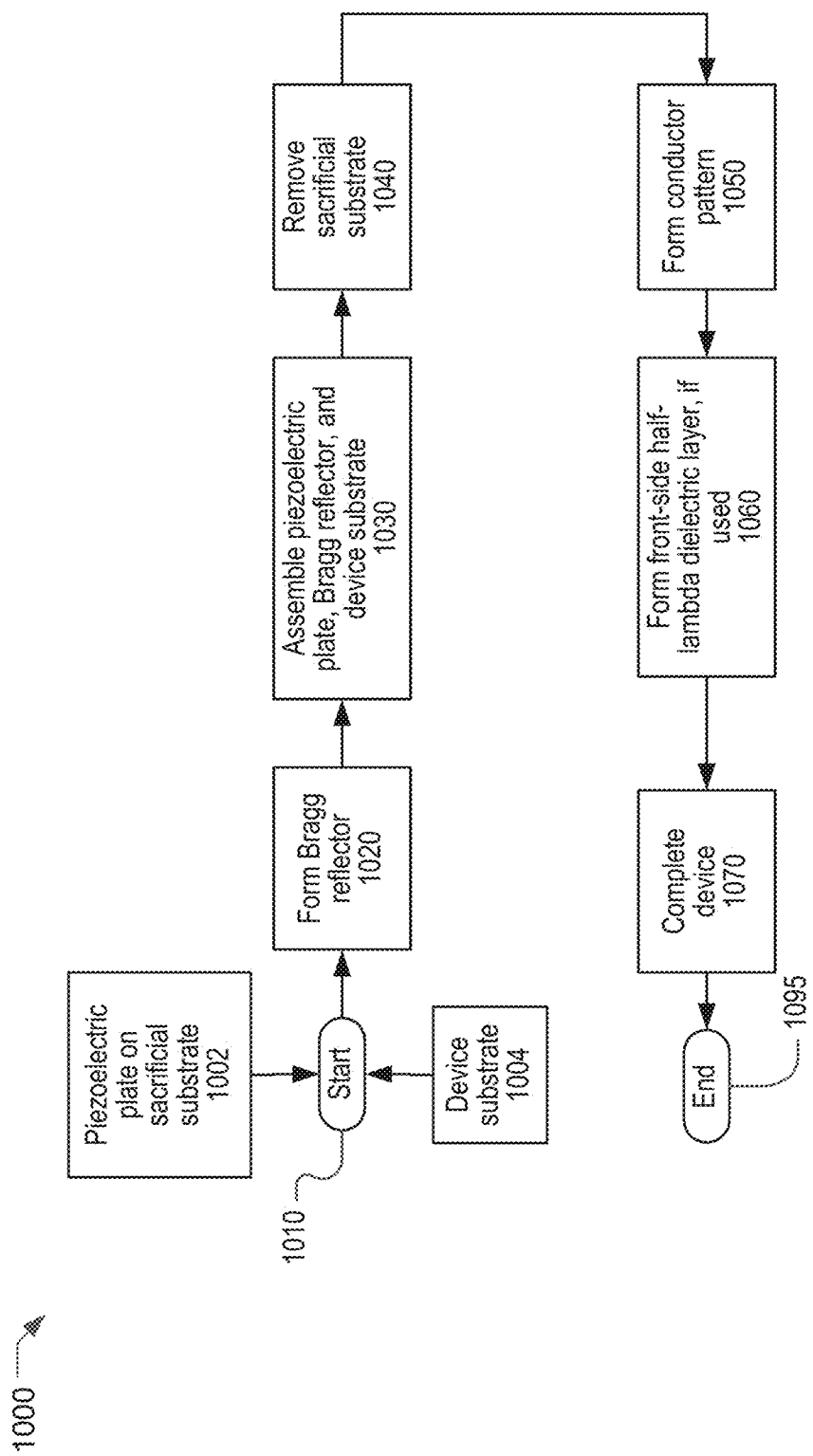
FIG. 10 illustrates a flowchart of a method of manufacturing a mass sensor including an XBAR as described herein.

FIG. 10 is a simplified flow chart of a method 1000 for making a SM XBAR or a sensor incorporating SM XBARs. The method 1000 starts at 1010 with a piezoelectric film disposed on a sacrificial substrate 1002 and a device substrate 1004. The method 1000 ends at 1095 with a completed SM XBAR or sensor. The flow chart of FIG. 10 includes only major process steps. Various conventional process steps (e.g., surface preparation, cleaning, inspection, baking, annealing, monitoring, testing, etc.) may be performed before, between, after, and during the steps shown in FIG. 10.

Thin plates of single-crystal piezoelectric materials bonded to a non-piezoelectric substrate are commercially available. At the time of this application, both lithium niobate and lithium tantalate plates are available bonded to various substrates including silicon, quartz, and fused silica. Thin plates of other piezoelectric materials may be available now or in the future. The thickness of the piezoelectric plate may be between 300 nm and 1000 nm. When the substrate is silicon, a layer of $SiO_2$ may be disposed between the piezoelectric plate and the substrate. The piezoelectric plate 1002 may be, for example, lithium niobate with a thickness of 400 nm (as used in all of the previous examples) bonded to a silicon wafer with an intervening $SiO_2$ layer. The device substrate 1004 may be silicon (as used in the previous examples), fused silica, quartz, or some other material.

At 1020 an acoustic Bragg reflector is formed by depositing alternating layers of $SiO_2$ and W. Each of the layers has a thickness equal to or about one-fourth of the acoustic wavelength.

At 1020, all of the layers of the acoustic Bragg reflector may be deposited on either the surface of the piezoelectric plate on the sacrificial substrate 1002 or a surface of the device substrate 1004. Alternatively, some of the layers of the acoustic Bragg reflector may be deposited on the surface of the piezoelectric plate on the sacrificial substrate 1002 and the remaining layers of the acoustic Bragg reflector may be deposited on a surface of the device substrate 1004.

Additionally or alternatively, formation of the Bragg reflector at 1020 may include formation of a back-side half-lambda dielectric layer. The back-side half-lambda dielectric layer may be deposited on the surface of the piezoelectric plate on the sacrificial substrate 1002 or may deposited on top of the Bragg reflector formed on the device substrate 1004.

At 1030, the piezoelectric plate on the sacrificial substrate 1002 and the device substrate 1004 may be bonded such that the layers of the acoustic Bragg reflector and the back-side half-lambda dielectric layer, if used, are sandwiched between the piezoelectric plate and the device substrate. The piezoelectric plate on the sacrificial substrate 1002 and the device substrate 1004 may be bonded using a wafer bonding process such as direct bonding, surface-activated or plasma-activated bonding, electrostatic bonding, or some other bonding technique. Note that, when one or more layers of the acoustic Bragg reflector are deposited on both the piezoelectric plate and the device substrate, the bonding will occur between or within layers of the acoustic Bragg reflector. Alternatively, depending on whether and how the back-side half-lambda dielectric layer is formed, the bonding may occur between the back-side half-lambda dielectric layer and the acoustic Bragg reflector or between the back-side half-lambda dielectric layer and the piezoelectric plate.

After the piezoelectric plate on the sacrificial substrate 1002 and the device substrate 1004 are be bonded, the sacrificial substrate, and any intervening layers, are removed at 1040 to expose the surface of the piezoelectric plate (the surface that previously faced the sacrificial substrate). The sacrificial substrate may be removed, for example, by material-dependent wet or dry etching or some other process.

A conductor pattern, including IDTs of each SM XBAR, is formed at 1050 by depositing and patterning one or more conductor layers on the surface of the piezoelectric plate that was exposed when the sacrificial substrate was removed at 1040. The conductor pattern may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1050 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1050 using a lift-off process. Photoresist may be deposited over the piezoelectric plate. And patterned to define the conductor pattern. The conductor layer and, optionally, one or more other layers may be deposited in sequence over the surface of the piezoelectric plate. The photoresist may then be removed, which removes the excess material, leaving the conductor pattern.

At 1060, a front-side half-lambda dielectric layer may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. For example, a first dielectric layer having a first thickness t1 may be deposited over the IDTs of one or more shunt resonators. A second dielectric layer having a second thickness t2, where t2 is equal to or greater than zero and less than t1, may be deposited over the IDTs of series resonators.

After the conductor pattern and front-side dielectric layer (if included) are formed at 1050 and 1060, the filter device may be completed at 1070. Actions that may occur at 1070 include depositing and patterning additional metal layers to form conductors other than the IDT conductor pattern; depositing an encapsulation/passivation layer such as $SiO_2$ or $Si_3O_4$ over all or a portion of the device; applying coatings, such as a binding partner that binds an analyte measured by a mass sensor; forming bonding pads or solder bumps or other means for making connection between the device and external circuitry; excising individual devices from a wafer containing multiple devices; other packaging steps; and testing. Another action that may occur at 1070 is to tune the resonant frequencies of the resonators within the device by adding or removing metal or dielectric material from the front side of the device. After the sensor device is completed, the process ends at 1095.

A variation of the process 1000 starts with a single-crystal piezoelectric wafer at 1002 instead of a thin piezoelectric plate on a sacrificial substrate of a different material. Ions are implanted to a controlled depth beneath a surface of the piezoelectric wafer (not shown in FIG. 10). The portion of the wafer from the surface to the depth of the ion implantation is (or will become) the thin piezoelectric plate and the balance of the wafer is the sacrificial substrate. The acoustic Bragg reflector is formed at 1020, as well as potentially a back-end half-lambda dielectric layer, as previously described and the piezoelectric wafer and device substrate are bonded at 1030 such that the acoustic Bragg reflector is disposed between the ion-implanted surface of the piezoelectric wafer 1002 and the device substrate 1004. At 1040, the piezoelectric wafer may be split at the plane of the implanted ions (for example, using thermal shock), leaving a thin plate of piezoelectric material exposed and bonded to the acoustic Bragg reflector. The thickness of the thin plate piezoelectric material is determined by the energy (and thus depth) of the implanted ions. The process of ion implantation and subsequent separation of a thin plate is commonly referred to as "ion slicing".

Throughout this description, the embodiments and examples shown should be considered as examples, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:

1. A bulk acoustic resonator comprising:
    a substrate having a surface;
    a piezoelectric plate having front and back surfaces;
    an interdigital transducer (IDT) at the front surface of the piezoelectric plate, wherein the IDT is configured to excite a primary shear acoustic mode within the piezoelectric plate;
    a half-lambda dielectric layer on at least one of the front surface or the back surface of the piezoelectric plate, wherein a thickness td of the half-lambda dielectric layer is defined as $0.85\lambda_{0,d} \leq 2td \leq 1.15\lambda_{0,d}$, where $\lambda_{0,d}$ is a wavelength of a fundamental shear bulk acoustic wave resonance in the half-lambda dielectric layer, wherein the thickness td of the half-lambda dielectric layer is in a direction normal to the surface of the substrate; and
    an acoustic Bragg reflector sandwiched between the substrate and at least one of the half-lambda dielectric layer and the back surface of the piezoelectric plate, the acoustic Bragg reflector configured to reflect the primary shear acoustic mode,
    wherein the acoustic Bragg reflector comprises alternating layers of a first material and a second material having a higher acoustic impedance than the first material, and
    wherein a top layer of the alternating layers of the acoustic Bragg reflector contacts at least one of the half-lambda dielectric layer and the back surface of the piezoelectric plate.

2. The bulk acoustic resonator of claim 1, wherein the piezoelectric plate is lithium niobate and the first material is $SiO_2$.

3. The bulk acoustic resonator of claim 1, wherein a thickness ts of the piezoelectric plate is defined as $2ts \approx \lambda_{0,s}$, where $\lambda_{0,s}$ is a wavelength of a fundamental shear bulk acoustic wave resonance in the piezoelectric plate, wherein the thickness ts is measured in the direction normal to the surface of the substrate.

4. The bulk acoustic resonator of claim 1, wherein the alternating layers of the second material comprise one or more layers of silicon nitride, aluminum nitride, silicon carbide, molybdenum, tungsten, gold, or platinum.

5. The bulk acoustic resonator of claim 1, wherein each of the alternating layers of the Bragg reflector has a thickness in a range of 75% to 125% of an acoustic wavelength corresponding to a resonance frequency of the bulk acoustic resonator, wherein the thickness of the alternating layers of the Bragg reflector is measured in the direction normal to the surface of the substrate.

6. The bulk acoustic resonator of claim 1, wherein the half-lambda dielectric layer is one or more of $SiO_2$, $Si_3N_4$, $Al_2O_3$, and AlN.

7. The bulk acoustic resonator of claim 1, further comprising the half-lambda dielectric layer at the front surface of the piezoelectric plate, such that the half-lambda dielectric layer at least partially covers the IDT at the front surface of the piezoelectric plate.

8. A gravimetric mass sensor comprising:
    the bulk acoustic resonator according to claim 7,
    wherein the gravimetric mass sensor is configured to produce a signal based on a change in mass of the gravimetric mass sensor device in a liquid sensing environment.

9. The gravimetric mass sensor of claim 8,
    wherein the gravimetric mass sensor is configured to produce a signal based on a change in mass of the mass sensor device in a gas sensing environment.

10. The bulk acoustic resonator of claim 1, further comprising the half-lambda dielectric layer at the back surface of the piezoelectric plate, such that the half-lambda dielectric layer contacts a top layer of the second material in the Bragg reflector.

11. A mass sensor device comprising:
    a substrate having a surface;
    a piezoelectric plate having front and back surfaces;
    an interdigital transducer (IDT) at the front surface of the piezoelectric plate;
    a first half-lambda dielectric layer at the front surface of the piezoelectric plate, such that the first half-lambda dielectric layer at least partially covers the IDT at the front surface of the piezoelectric plate;
    a second half-lambda dielectric layer at the back surface of the piezoelectric plate; and
    an acoustic Bragg reflector sandwiched between the surface of the substrate and the back surface of the piezoelectric plate, the acoustic Bragg reflector configured to reflect a primary acoustic mode, wherein a thickness td of each of the first and second half-lambda dielectric layers is defined as $0.85\lambda_{0,d} \leq 2td \leq 1.15\lambda_{0,d}$, where $\lambda_{0,d}$ is a wavelength of a fundamental shear bulk acoustic wave resonance in the respective first and second half-lambda dielectric layers, wherein the thickness td of the first and second half-lambda dielectric layers is in a direction normal to the surface of the substrate, wherein the acoustic Bragg reflector comprises alternating layers of a first material and a second material having a higher acoustic impedance than the first material, and wherein a top layer of the second material of the alternating layers of the acoustic Bragg reflector contacts the second half-lambda dielectric layer.

12. The mass sensor device of claim 11, wherein the IDT is configured to excite a primary shear acoustic mode within the piezoelectric plate.

13. The mass sensor device of claim 11, wherein the piezoelectric plate is lithium niobate and the first material is $SiO_2$.

14. The mass sensor device of claim 11, wherein a thickness ts of the piezoelectric plate is defined as $2ts \approx \lambda_{0,s}$, where $\lambda_{0,s}$ is a wavelength of the fundamental shear bulk acoustic wave resonance in the piezoelectric plate, wherein the thickness ts is measured in the direction normal to the surface of the substrate.

15. The mass sensor device of claim 11, wherein the alternating layers of the second material comprise one or more layers of silicon nitride, aluminum nitride, silicon carbide, molybdenum, tungsten, gold, or platinum.

16. The mass sensor device of claim 11, wherein each of the alternating layers of the Bragg reflector has a thickness in a range of 75% to 125% of an acoustic wavelength corresponding to a resonance frequency of the mass sensor device, wherein the thickness of each of the alternating layers of the Bragg reflector is measured in the direction normal to the surface of the substrate.

17. The mass sensor device of claim 11, wherein each of the first and second half-lambda dielectric layers is one or more of $SiO_2$, $Si_3N_4$, $Al_2O_3$, and AlN.

18. A gravimetric mass sensor comprising:
the mass sensor device according to claim 11,
wherein the gravimetric mass sensor is configured to produce a signal based on a change in mass of the mass sensor device in a liquid sensing environment.

19. A bulk acoustic resonator comprising:
a substrate having a surface;
a piezoelectric plate having front and back surfaces;
an interdigital transducer (IDT) at the front surface of the piezoelectric plate;
a half-lambda dielectric layer on the back surface of the piezoelectric plate; and
an acoustic Bragg reflector sandwiched between the surface of the substrate and the back surface of the piezoelectric plate, the acoustic Bragg reflector configured to reflect a primary acoustic mode,
wherein the acoustic Bragg reflector comprises alternating layers of a first material and a second material having a higher acoustic impedance than the first material,
wherein a top layer of the alternating layers of the acoustic Bragg reflector contacts the half-lambda dielectric layer,
wherein the IDT is configured to excite a primary shear acoustic mode within the piezoelectric plate, and
wherein a thickness td of the half-lambda dielectric layer is defined as $0.85\lambda_{0,d} \leq 2td \leq 1.15\lambda_{0,d}$, where $\lambda_{0,d}$ is a wavelength of a fundamental shear bulk acoustic wave resonance in the half-lambda dielectric layer, and the thickness td of the half-lambda dielectric layer is measured in a direction normal to the surface of the substrate.

* * * * *